United States Patent [19]
Ishiguro

[11] Patent Number: 5,976,989
[45] Date of Patent: Nov. 2, 1999

[54] THIN FILM TRANSISTOR FABRICATION METHOD, ACTIVE MATRIX SUBSTRATE FABRICATION METHOD, AND LIQUID CRYSTAL DISPLAY DEVICE

[75] Inventor: Hideto Ishiguro, Suwa, Japan

[73] Assignee: Seiko Epson Corporation, Nagano-Ken, Japan

[21] Appl. No.: 08/809,935

[22] PCT Filed: Aug. 5, 1996

[86] PCT No.: PCT/JP96/02211

§ 371 Date: Apr. 3, 1997

§ 102(e) Date: Apr. 3, 1997

[87] PCT Pub. No.: WO97/06565

PCT Pub. Date: Feb. 20, 1997

[30] Foreign Application Priority Data

Aug. 4, 1995 [JP] Japan .................................. 7-199818

[51] Int. Cl.[6] .................................................. H01L 21/31
[52] U.S. Cl. ........................... 438/758; 438/765; 438/770
[58] Field of Search ................................... 438/626, 656, 438/723, 624, 699, 149, 758, 151, 770, 765

[56] References Cited

U.S. PATENT DOCUMENTS

| | | |
|---|---|---|
| 4,872,947 | 10/1989 | Wang et al. . |
| 5,120,680 | 6/1992 | Foo et al. . |
| 5,426,076 | 6/1995 | Moghadam . |
| 5,858,819 | 1/1999 | Miyasaka ................................. 438/149 |

FOREIGN PATENT DOCUMENTS

| | | |
|---|---|---|
| 0510696 | 4/1992 | European Pat. Off. . |
| 64-50429 | 2/1989 | Japan . |
| 5-74763 | 3/1993 | Japan . |
| 5-239649 | 9/1993 | Japan . |
| 6-37315 | 2/1994 | Japan . |
| 6-53504 | 2/1994 | Japan . |
| 6-177123 | 6/1994 | Japan . |
| 6-240459 | 8/1994 | Japan . |
| 6-330322 | 11/1994 | Japan . |
| 7-90589 | 4/1995 | Japan . |
| 8-55996 | 2/1996 | Japan . |
| 8-78695 | 3/1996 | Japan . |

OTHER PUBLICATIONS

Sharp Technical Journal (No. 6, Apr. 1995) Low Temperature Deposition of High Quality Silicon Dioxide Films.

*Primary Examiner*—John F. Niebling
*Assistant Examiner*—Christopher Lattin
*Attorney, Agent, or Firm*—Oliff & Berridge, PLC

[57] ABSTRACT

To provide a TFT fabrication method capable of forming on a large-surface area substrate with uniform film thickness and at high deposition rate of film, while being a low-temperature process, a high-quality gate insulation film having good charge behavior by forming a silicon oxide film by a thin film transistor fabrication method having a channel region connected to a source region and a drain region, and a gate electrode confronting with the channel region through a gate insulation film, wherein in the formation process of said gate insulation film using plasma chemical vapor deposition under the condition that tetraethoxysilane is used as the feed gas to provide the silicon and the distance between electrodes for generating the plasma is about 15 mm or less.

18 Claims, 21 Drawing Sheets

THIN FILM TRANSISTOR FABRICATION METHOD, ACTIVE MATRIX SUBSTRATE FABRICATION METHOD, AND LIQUID CRYSTAL DISPLAY DEVICE

FIELD OF TECHNOLOGY

The present invention relates to technology for the formation of a gate insulation film for a thin film transistor (henceforth, TFT) used as the active element of a liquid crystal display, and so on, and to a liquid crystal display.

BACKGROUND TECHNOLOGY

Regarding methods of fabrication of thin film transistors (TFT) used as the active elements in liquid crystal displays, from the viewpoint of devising the increase of surface area and the reduction of cost, low-temperature processes and the use of inexpensive glass substrates are desirable. In such a low-temperature process, it is necessary to be able to form large-grain polysilicon films that are equivalent to those of high-temperature processes, and to activate the impurities sufficiently. Further, it is important to be able to form high-quality gate insulation films having a film quality equal to or greater than thermal oxide films.

As technology for forming gate insulation films at low temperatures, there have been from the past film formation methods such as atmospheric-pressure CVD method, low-pressure CVD method, ECR-CVD method and the like. Atmospheric-pressure CVD method and low-pressure CVD method are high in productivity, but the film quality as gate insulation films is inferior. For example, there are such problems as the increase of the space charge and surface charge in silicon oxide films, the degradation of the properties of the current at on state, the degradation of the properties of the leakage current at off state, and the shift of the threshold voltage of TFTs. Also, in the ECR-CVD method, the film quality is comparatively good, but there is a problem that the productivity is markedly low, and all of the prior film formation methods do not satisfy the conditions for film formation of gate insulation films of TFT used for the active elements of liquid crystal displays.

Also, as a low-temperature process for forming silicon oxide films, other than the above-mentioned film formation methods, there is also the plasma-enhanced chemical vapor deposition method (plasma CVD method). The plasma CVD method is a film formation method whereby a film is formed by causing a discharge in a feed gas within a reaction chamber by applying a high frequency electric power between electrodes, and causing a reaction to break down the feed gas with the plasma formed thereby. Because such a film formation method has the advantages of a high deposition rate of film, a low stress applied to the substrate, a good step coverage, and the like, it has been used up to the present for the formation of interlevel insulator film of semiconductor integrated circuits. Also, as published in *Sharp Giho* (Sharp Technical Journal) (No. 61, April 1995), it is coming to be seen as a film formation method for forming gate insulation films of TFT as well. The conditions of the plasma CVD method examined here are that the distance between electrodes for generating the plasma is within the range of 35 mm to 65 mm, and the pressure inside the reaction chamber is in the range of 800 mtorr to 1200 mtorr, and conditions having exceeded such ranges are not suitable for forming gate insulation films of TFT. Such is suggested in *Sharp Giho,* and others. The properties of film formation have been evaluated within the scope of such conditions because in addition to the space charge inside a silicon oxide film occurring more easily as the distance between the electrodes is made smaller, an surface state is generated more easily on the surface of a semiconductor film in contact with the silicon oxide film. Furthermore, the properties of the current at on state and leakage current at off state of the TFT trend to be degraded due to the presence of a surface charge originating in this surface state. Further the properties have been evaluated within the scope of conditions mentioned above, because the properties of the current at on state and leakage current at off state of the TFT tend to be degraded more as the pressure inside the reaction chamber is lowered more.

However, the plasma CVD method has not arrived at the point where it genuinely can be applied to a gate insulation film of TFT formation process as examined by changing various parameters within the above-mentioned scope of conditions. This is because when forming a gate insulation film of TFT, which is different from depositing a silicon oxide film on a comparatively narrow substrate such as a silicon wafer as a interlevel insulator film, not only is the deposition rate of film high, the stress applied to the substrate low, and the step coverage satisfactory, but there are additional conditions inherent to this field. Namely since a gate insulation film of TFT is being formed, the electrical properties related to the space charge and surface state of the aforementioned silicon oxide film must be satisfactory. Moreover, it is desirable to be able to form evenly and at high speed a silicon oxide film on the entirety of a large-surface area substrate being 360 mm×465 mm, such as an active matrix of a liquid crystal display panel. However, by only applying the film formation conditions used in the formation of interlevel insulator film of semiconductor integrated circuits to the formation of gate insulation films of TFT, the conditions mentioned above cannot be satisfied.

For example, following conditions are set when forming a silicon oxide film under the conventional technology in plasma CVD method: the distance between electrodes is 35 mm, the pressure in the reaction chamber is 1500 mtorr, and the TEOS gas flow is 30 SCCM or less. Setting the film formation conditions from the viewpoint of obtaining a silicon oxide film having satisfactory electrical properties related to the space charge and the surface state, not only causes the deposition rate of film to drop markedly to about 250 Angstrom/minute, if the value obtained from Equation (1) by the evaluation method explained below, which is expressed in terms of deviation of the film thickness, but also causes the result to be extremely high, being about 20% higher. Here, to be genuinely applicable to the formation process of a gate insulation film of TFT, it is necessary to secure a deposition rate of film of 700 Angstrom/minute or more, and to suppress deviation of the film thickness to 7% or less.

In consideration of such problems, the object of the present invention is to provide a TFT fabrication method, being a low-temperature process, that can form a film at a high speed and have an even film thickness across a large-surface area substrate to produce a high-quality gate insulation film having satisfactory charge behavior. A deposition rate of a film can be increased.

DISCLOSURE OF THE INVENTION

In order to solve the above-mentioned problems, the inventors of the present invention have performed repeated examinations regarding the conditions up to now thought not to apply as conditions for forming films as gate insulation films in the plasma CVD method. As a result, it was discovered that a silicon oxide film suitable as a gate insulation film of TFT can be formed within the scope of such conditions, and the use of a silicon oxide film formed under such film formation conditions as a gate insulation film of TFT is proposed.

The invention as defined in claim 1 of the present invention is a method of fabricating a thin film transistor having a gate electrode facing against a channel region through a gate insulation film, wherein in the gate insulation film formation process, a silicon oxide film is formed by using plasma chemical vapor deposition method under the condition that tetraethoxysilane, a.k.a. TEOS, is used as the gas to provide the silicon, and the distance between electrodes for generating the plasma is about 15 mm or less.

Under this condition, it is possible to improve the electrical film properties such as charge behavior without sacrificing the deposition rate of the film and the uniformity of the film thickness. Therefore, it is possible to fabricate on a large substrate a TFT having stable current at on state and leakage current at off state at high productivity.

Also, the invention of claim 3 relates to a method of fabricating a thin film transistor having a gate electrode facing against a channel region through a gate insulation film, wherein in the gate insulation film formation process, a silicon oxide film is formed by using plasma chemical vapor deposition method under the condition that tetraethoxysilane is used as the gas to provide the silicon, and the reaction chamber is at a low pressure of 700 mtorr or less.

Under this condition, either the deposition rate of the film or electrical film properties can be improved without greatly sacrificing the other. Furthermore, in this case the uniformity of film thickness is not sacrificed. Therefore, it is possible to fabricate on a large substrate and at high productivity a TFT having stable current at on state and leakage current at off state.

Also, the invention of claim 5 has features that in the gate insulation film formation process, a silicon oxide film is formed by using plasma chemical vapor deposition method under the condition that tetraethoxysilane is used as the gas to provide the silicon, and the reaction chamber is at a low pressure of 700 mtorr or less in the thin film transistor fabrication method defined as in claim 1.

Under this condition, it is possible to improve the uniformity of film thickness more as the electromagnetic power (power source output) applied between the electrodes is made smaller, and there is substantially no sacrificing of the electrical film properties such as the deposition rate of films and charge behavior.

Moreover, the invention of claim 7 has features that in the gate insulation film formation process, a silicon oxide film is formed by using oxygen gas as the feed gas to provide oxygen in the thin film transistor fabrication method of any of the claims 1 through 5.

Moreover, the invention of claim 10 has features that in the active matrix substrate fabrication method as defined in claim 9, a capacitive-dividing type digital/analog converter is included.

Under this fabrication method, it becomes possible to digitize the signal generator that provides signals to the active matrix substrate, and it becomes possible to provide a liquid crystal device having low power consumption.

DESCRIPTION OF THE PREFERRED EMBODIMENTS

Figure 1A:
FIG. 1 is a cross-sectional view of one example of a TFT fabrication process.
Figure 1B:
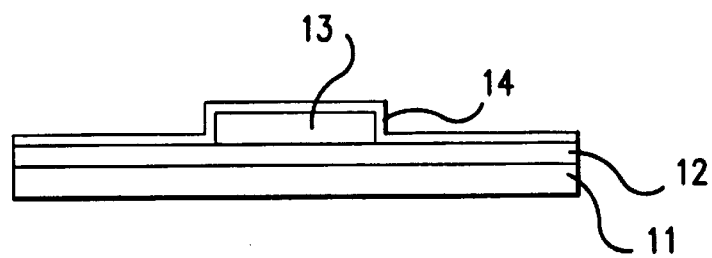
Figure 1C:
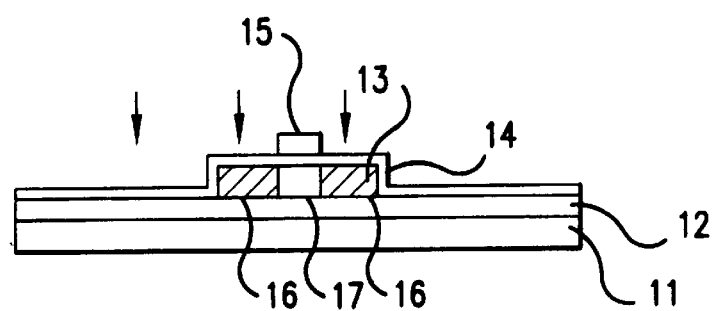
Figure 1D:
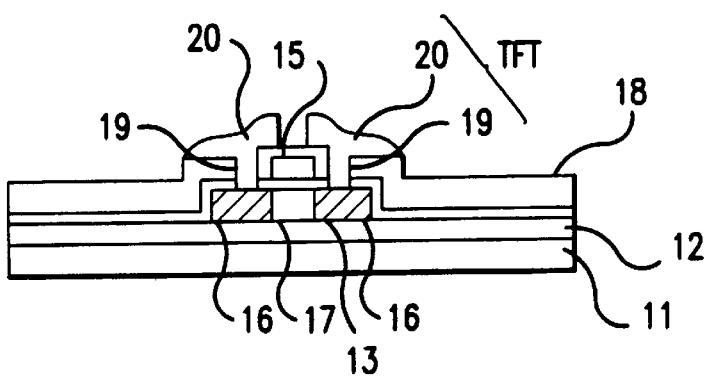

The present invention is explained below, referring to the drawings.

[One Example of a TFT Fabrication Method]

The present invention has special features in the gate insulation film formation process within the TFT fabrication method. But before explaining these special features, a general TFT fabrication method is explained, referring to FIG. 1.

In FIG. 1($a$), first, an undercoating protective layer 12 (silicon oxide film) having a film thickness of 1000–3000 Angstrom, preferably 2000 Angstrom, is formed by plasma CVD method on the surface of a glass substrate 11. The feed gases at this time are TEOS gas and oxygen gas. The undercoating protective layer 12 can be formed by other CVD methods. Also, an insulation film such as a silicon nitride film, or a multi-layer film of such can be used as well.

Next, an intrinsic silicon film 13 (amorphous silicon film) is deposited to the extent of 600 Angstrom on the surface of the undercoating protective layer 12. For example, polycrystallization of the silicon film 13 is performed by solid phase growth for 24 hours at a processing temperature of 600° C. In such polycrystallization, laser annealing and rapid thermal processing (RTA), and the like can be also used, at still lower processing temperatures. Thereafter, the silicon film 13 is processed to a specified shape using photolithography technology.

Next, a gate insulation film 14 made of silicon oxide film having the thickness of 300–3000 Angstrom, preferably 1200 Angstrom, is formed on the silicon film 13. In this process, the silicon oxide film is formed by plasma CVD method by a low-temperature process having a film formation temperature of 400° C. or less, as explained below. The feed gases at this time are tetraethoxysilane (Si—(O—CH$_2$—CH$_3$)$_4$), a.k.a. TEOS gas, and oxygen gas, the tetraethoxysilane providing the silicon and the oxygen gas providing the oxygen.

Next, a tantalum thin film having a thickness of 6000 Angstrom is formed on the surface of the gate insulation film 14 by sputtering. Then it is patterned using photolithography technology, and a gate electrode 15 is formed as shown in FIG. 1($c$). The tantalum thin film can be formed also by CVD method, or the like.

Next, using a bucket-type non-mass-separating ion implantation apparatus (ion doping apparatus), ions of impurities are implanted in the silicon film 13 from the top of the gate insulation film using the gate electrode 15 as a mask. As a result, source/drain regions 16 are formed self-aligning in relation to the gate electrode 15. In this case, the part within the silicon film 13 where ions of impurities were not implanted becomes the channel region 17. In this example, 50% phosphine (PH$_3$) gas diluted with hydrogen gas is used, and the accelerated voltage is 100 keV. The total quantity of ions is 1×10$^{16}$ cm$^{-2}$. When forming a P-channel TFT, 5% diborane (B$_2$H$_6$) diluted with hydrogen gas is used. Also, in this case it is possible also to implant the impurities after etching a part or all of the gate insulation film on the source/drain part. Furthermore, it is possible also to perform the implantation of the ions of impurities by using a mass-separating ion implantation apparatus as commonly used in the fabrication of semiconductor integrated circuits.

Next, as shown in FIG. 1($d$), a silicon oxide film having the thickness of 5000 Angstrom is formed by plasma CVD method as an interlevel insulator film 18. In this case, the feed gas is TEOS gas and oxygen gas.

Next, thermal processing is performed for one hour at 300° C., and activation of the implanted ions of purities and reforming of the interlevel insulator film 18 are performed. A thermal processing temperature in the range from 300° C. to 450° C. is desirable, and an atmosphere of N$_2$, O$_2$ or H$_2$ is desirable.

Next, a contact hole 19 is formed in the interlevel insulator film 18. Thereafter, source/drain electrodes 10 are electrically connected to the source/drain region 16 through contact hole 19, and the TFT is formed.

The above-mentioned fabrication method is still only an example, and low-density regions or offset regions may be provided in the regions confronting with the sides of the gate electrode 15. In either case, the gate insulation film (silicon oxide film) formation method explained below can be applied.

[Configuration of a Plasma Chemical Vapor Deposition Apparatus]

Figure 2:
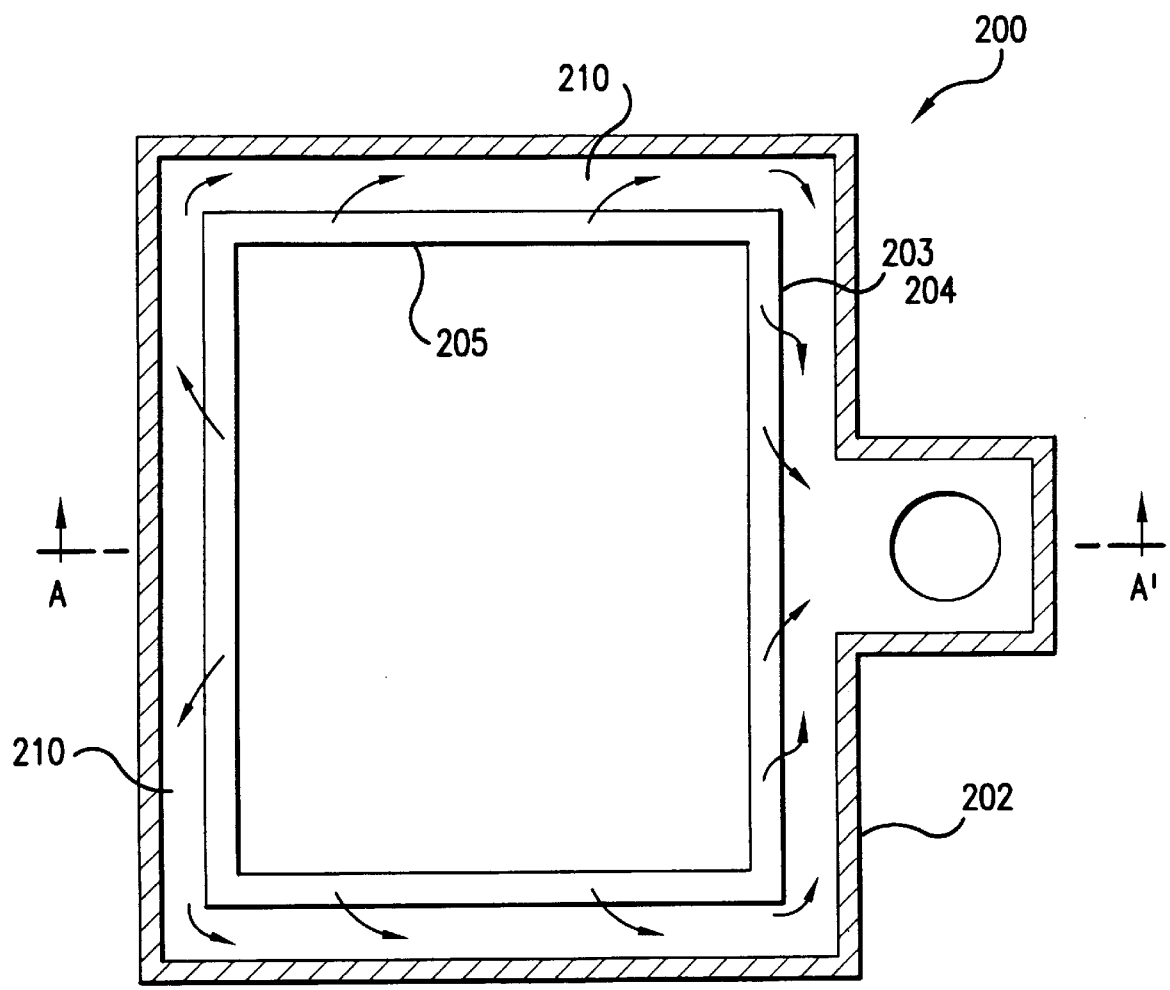
FIG. 2 is a schematic plane view of the vicinity of the reaction chamber of a plasma chemical vapor deposition apparatus.
Figure 3:
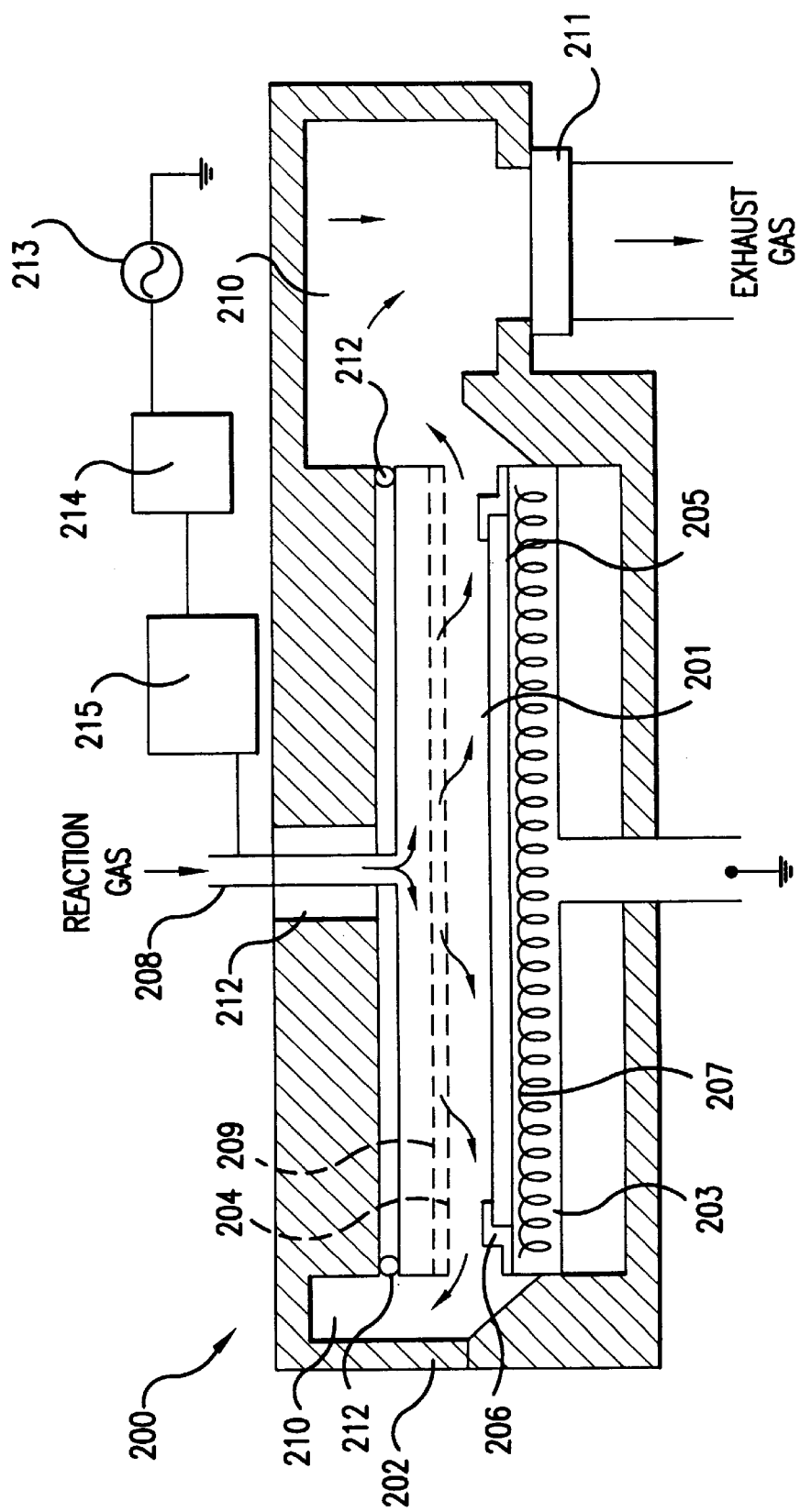
FIG. 3 is a cross-sectional view in the A-A' line of FIG. 2.

Of all the processes for fabricating TFTs, the present example uses a plasma CVD apparatus (plasma chemical vapor deposition apparatus) as shown in FIG. 2 and FIG. 3 in the gate insulation film formation process, and the like.

FIG. 2 is a schematic plane view of the vicinity of the reaction chamber of a plasma CVD apparatus, and FIG. 3 is a cross sectional view in the A-A' line of the apparatus.

In these drawings, the plasma CVD apparatus 200 of the present example is a capacitive-coupling type such that the plasma is generated using high-frequency power between parallel flat electrodes.

In the plasma CVD apparatus 200, a reaction chamber 201 is isolated from the outside air by a reaction vessel 202, and throughout film formation it is placed in a low-pressure state from about 5 mtorr to about 5 torr. Inside the reaction vessel 202 a lower flat electrode 203 and an upper flat electrode 204 are placed in parallel to each other, and these two electrodes constitute the parallel flat electrodes. The reaction chamber 201 is formed between the parallel flat electrodes consisting of the lower flat electrode 203 and the upper flat electrode 204. In this example, 410 mm×510 mm parallel flat electrodes are used, and the distance between the electrodes is variable. The capacity of the reaction chamber 201 is also variable in the range from 2091 $cm^3$ to 10455 $cm^3$ according to variation of the distance between the electrodes. The variation of the distance between the electrodes can be performed by raising and lowering the position of the lower flat electrode 203, and any distance can be set. The change of the distance between the electrodes in the inner surfaces of the parallel flat electrodes is a mere 0.1 mm when the distance between the electrodes is a given value. Consequently, the change of the field strength occurring between the electrodes is 1.0% or less in the inner surfaces of the parallel flat electrodes, and the plasma is generated evenly in the reaction chamber 201.

On top of the lower flat electrode 203 a large-scale glass substrate 205 is placed for deposition of the thin film, and 2 mm of the edge part of the substrate 205 is pressed against by a shadow frame 206. In FIG. 2, the shadow frame 206 is omitted so that the configuration of the apparatus would be easy to understand.

A heater 207 for heating the substrate 205 is provided, inside the lower flat electrode 203 and the temperature of the lower flat electrode 203 can be set arbitrarily between 25° C. to 400° C. When the temperature of the electrode has been set to a given value, the temperature distribution within the inner surface of the lower flat electrode 203 excluding a 5 mm perimeter is within ±1° C. in relation to the set temperature, and the substrate temperature can be controlled uniformly.

The shadow frame 206, for example, when a general glass substrate (e.g., 7059 made by Corning Japan, OA-2 made by Nippon Electric Glass, or NA35 made by NH Techno Glass, etc.) is used as the substrate 205, prevents bowing deformation of the substrate 205 due to the heat from the heater 207, and in addition, it presses the substrate 205 such that useless thin film is not formed on the edges and underneath of the substrate.

The reaction gas consisting of the gas to be the feed gas and an additional gas according to need is introduced inside the upper flat electrode 204 through piping 208, and furthermore, it flows into the reaction chamber 201 at a substantially uniform pressure from the entire surface of the upper flat electrode 204 by escaping through gas diffusion plates 209 provided inside the upper flat electrode 204. During film formation, a part of the reaction gas is separated at the point where it has issued from the upper flat electrode 204, and a plasma is generated between the parallel flat electrodes. A part to all of the reaction gas contributes to the film formation. As opposed to this, the residual reaction gas not having contributed to the film formation and the gas caused as a result of the chemical reactions of the film formation are exhausted as exhaust gas from exhaust holes 210 provided on the upper perimeter of the reaction vessel 202.

The conductance of the exhaust holes 210 is desirably 100 times or more the conductance between the parallel flat electrodes. Furthermore, the conductance between the parallel flat electrodes is desirably much greater than the conductance of the gas diffusion plates 209, and still that value is desirably 100 times or more the conductance of the gas diffusion plates 209. By being configured in this manner, the reaction gas is introduced into the reaction chamber 201 at a substantially uniform pressure from the entire surface of a large-scale, 410 mm×510 mm upper flat electrode 204, and simultaneously the exhaust gas is exhausted from the reaction chamber 201 at a uniform rate of flow in all directions.

The flow rate of the various types of reaction gases is adjusted to the specified values by a mass flow controller (not illustrated) before being introduced into the piping 208. Also, the pressure inside the reaction chamber 201 is adjusted to the specified value by a conductance valve 211 provided at the exit of the exhaust holes. On the exhaust side of the conductance valve 211 is provided a vacuum exhaust apparatus (not illustrated) such as a turbo molecular pump. In the present example, an oil-free magnetic levitation type turbo molecular pump is provided as one part of the vacuum exhaust apparatus, and the degree of background vacuum inside the reaction chamber is at a level of $10^{-7}$ torr.

In FIG. 2 and FIG. 3, the gas flow is indicated by the arrows. The reaction vessel 202 and the lower flat electrode 203 are in grounded potential, and the electrically insulated state between these and the upper flat electrode 204 is maintained by an insulating ring 212. During plasma generation, after the RF waves output from the oscillating source 213 (power source) are amplified by an amplifier 214, they are applied to the upper flat electrode 204 via a matching circuit 215.

The plasma CVD apparatus 200 used in the present example is constituted as a thin film formation apparatus applicable to large-scale, 400 mm×500 mm substrates by realizing extremely precise control of the distance between the electrodes and the flow of gas as described above. If these fundamental thoughts on design are followed, apparatuses can be easily applied to large-scale substrates such as 550 mm×650 mm.

In the present example, an RF power source was used, but power sources giving out microwaves and VHF waves also may be used. Also, the RF power source may be set to any wavelength being an integer multiple of the industrial RF wavelength (13.56 MHz), such as 27.12 MHz, 40.6 MHz, 54.24 MHz, 67.8 MHz, etc. The modification of such wavelengths can be performed easily by exchanging the oscillation source 213, the amplifier 214, and the matching circuit 215. With the electromagnetic wave plasma, when the wavelength is increased, the electronic temperature within the plasma increases, and generation of radicals becomes easier.

[Results of Examination of Film Formation Conditions and Film Formation Properties]

In this example, using such a plasma CVD apparatus, silicon oxide films were formed under the conditions shown in Table 1, and their film formation properties were evaluated. The results of each evaluation are shown in FIG. 4 through FIG. 27.

In these examinations, first, the amorphous silicon films are formed on 360 mm×465 mm substrates and made into polycrystalline silicon films by solid phase growth.

Next, the silicon oxide films were formed by plasma CVD method on the surfaces of the polycrystalline silicon films while changing the film formation conditions as explained below. The film formation conditions in this plasma CVD method are: the silicon oxide films were formed by changing the flow rate of TEOS, the flow rate of oxygen, power of RF power source (output), the distance between the electrodes of the parallel flat electrodes, the pressure (degree of vacuum) inside the reaction chamber, and the substrate temperature of the film formation time. In the following examinations, the frequency of the RF power source is fixed at 13.56 MHz. During film formation, first a substrate is moved into the reaction chamber, and after momentarily drawing a vacuum, stabilization of the substrate temperature was performed for 5 minutes without providing the RF electric power under the gas flow and the reaction chamber pressure, which are the film formation conditions. After that, the RF source power is applied and film formation is performed. The stabilization time of the substrate temperature may be set to 10 minutes depending on the film formation conditions, and it is also possible to make the gas flow and the reaction chamber pressure different values, compared with the value of the film formation times. Also, it is possible to provide a preheating chamber separate from the reaction chamber, and to shorten the stabilization time of the substrate temperature to as few as 45 seconds to 1 minute by preheating the substrate temperature to as much as 300° C. before moving the substrate into the film formation chamber.

Along with measuring the deposition rate of film (a film formation property), the film thickness after film formation was measured on a diagonal line in the region excluding 12 mm from the ends. Deviation of the film thickness (a film formation property) are also measured.

Among all the measurements pertaining to film thickness, those marked with white circles in each graph (FIG. 4 through FIG. 27) showing the results are results measured by difference-in-levels measurement, and those marked with black circles are results measured by ellipsometry.

As for the deposition rate of the film, from the viewpoint of improving throughput, the higher deposition rate is better, but a level of about 700 Angstrom/minute is also an allowable level. However, if the deposition rate of the film is this value or lower, industrial difficulties increase severely for the reasons below.

During film formation, as the gases inside the reaction chamber, there are tetraethoxysilane and oxygen supplied through the upper electrode and the gases generated by the reactions, but in addition, there are undesirable mixed gases. The taking in of part of the mixed gases into the formed film, invites degradation of the film quality such as forming space charge, the loss of the film's insulating property, and the like. As such mixed gases, there are atmospheric leakage gases from the seams of the components constituting the reaction chamber, and back-flow gases of the vacuum exhaust apparatus, but if one attempts to avoid them completely, the plasma chemical vapor deposition apparatus becomes extremely costly, and the manufacturing cost of the thin film transistors is increased. Also, as other mixed gases there are detached gases having been attached to the walls of the reaction chamber. For said plasma chemical vapor deposition apparatus, in order to prevent the generation of particles caused by the peeling off of films formed on the walls, it is necessary to eliminate the films having attached to the walls of the reaction chamber by etching them at high frequency. Because fluorine radicals generated by plasma decomposing such gases as nitrogen trifluoride, sulfur hexafluoride, and fluorine gas are used at that time, the fluorine and fluorine compounds produced at that time attach to the walls and become mixed gases. To avoid completely this phenomenon, after eliminating the films attached to the walls of the reaction chamber by etching them, it is necessary to bake the walls of the reaction chamber for a long time, but this is not practical. Consequently, as a realistic method, it is necessary to supply a larger amount of quantity of feed gas into the reaction chamber, compared with the mixed gases, and to perform film formation at a fast deposition rate of film. According to repeated film formation/film quality evaluation experiments, in order to prevent the degradation of film quality due to such mixed gases, a deposition rate of a film of 300 Angstrom/minute, preferably 700 Angstrom/minute, was necessary.

Deviation of the film thickness is evaluated by the value sought in the following equation.

Deviation of film thickness (%) =
((maximum value of film thickness − minimum value of film thickness) /
(maximum value of film thickness + minimum value of film thickness) ) × 100 . . . Equation (1)

It is desirable that the uniformity of the film thickness be 7% or less from the viewpoint of suppressing deviation of the properties among TFTs.

Figure 29:
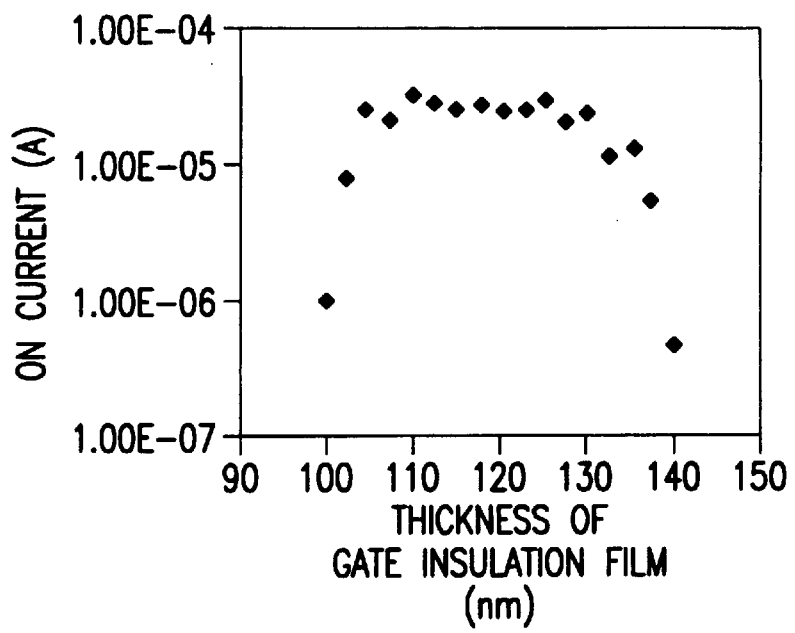
FIG. 29 is a graph showing the relationship between current at on state of TFT and a gate insulation film of a TFT.
Figure 30:
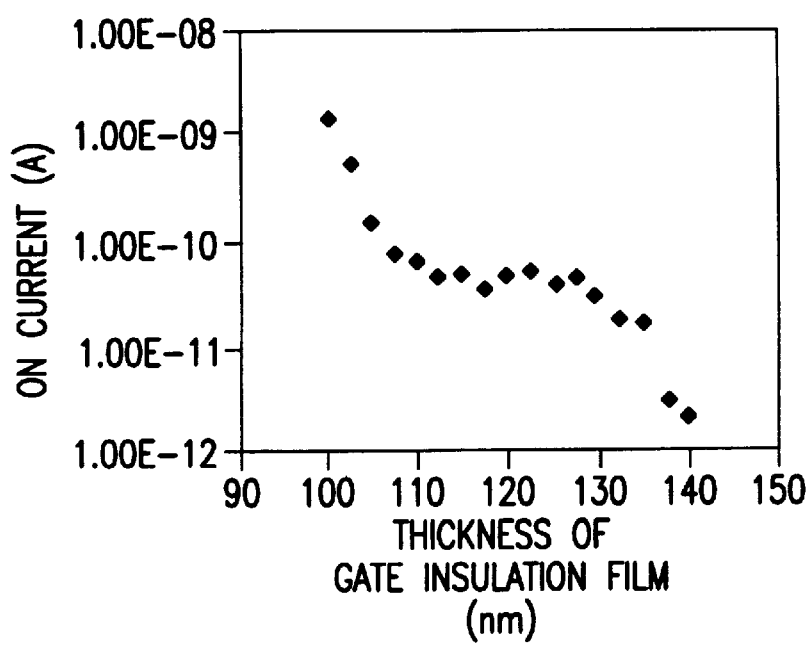
FIG. 30 is a graph showing the relationship between current at off state of TFT and a gate insulation film of a TFT.

FIG. 29 shows the relationship between the film thickness of a gate insulation film of TFT and the current at on state (drain current when gate voltage is 10 V and drain voltage is 4 V), and FIG. 30 is a drawing showing the relationship with the current at off state (drain current when gate voltage is 0V and drain voltage is 8 V). For the formation of the source/drain regions of the TFT at this time, the aforementioned ion doping apparatus was used, and a method of implanting phosphorus at 100 keV was used. If the gate insulation film becomes 1320 Angstrom or more, the current at on state decreases suddenly. This is because the density of the phosphorus implanted in the source/drain regions decreases by the gate insulation film becoming thicker. Also, if the gate insulation film becomes 1080 Angstrom or less, in addition to the current at on state decreasing, a severe increase in current at off state is seen. This is because a damaged layer has occurred concomitant with the ion implantation on the semiconductor layer of the interface contacting the channel region of the source/drain regions and contacting the silicon oxide film. It is well-known that, when performing doping of impurities by performing ion implantation, a damaged layer having a greatest damaged density occurs at the degree to ⅔ the depth of the depth showing the maximum value of the ion density. When the gate insulation film is thin, this damaged layer occurs inside the semiconductor layer and invites decreasing of the current at on state due to it working as an unnecessary resistance layer, and at the same time it invites the increase of current at off state due to the leakage current generated across the damaged layer. Consequently, it is necessary that the uniformity of the gate insulation film within the substrate be at least ±10% within the substrate, also, when considering that the iterative precision of the average film thickness of the gate insulation films for each film formation is 2–3%, it is desirable to be ±7% or less.

Figure 31:
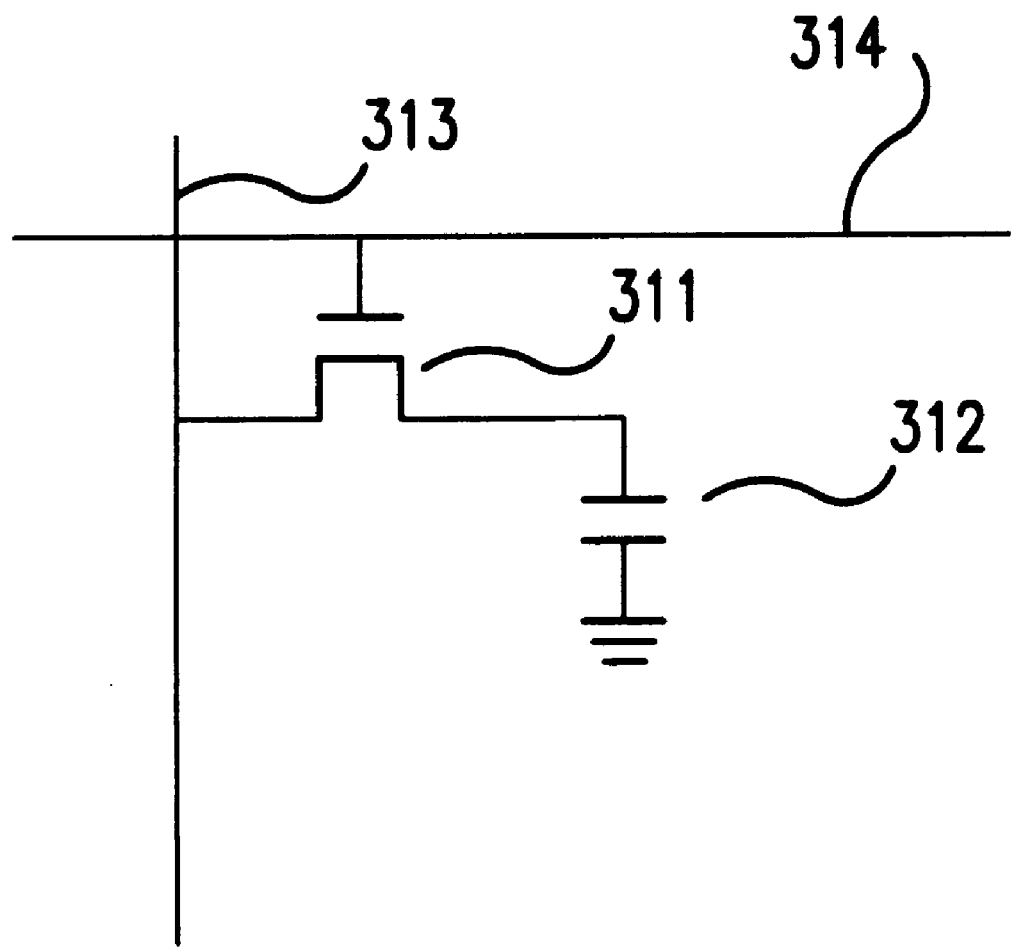
FIG. 31 is a view showing a circuit equivalent to one pixel of a liquid crystal device using a TFT.

There is an application of pixel switching element of a liquid crystal display device as the most important application of thin film transistors. FIG. 31 shows an equivalent circuit corresponding to one pixel when assembling thin film transistors and liquid crystal elements. 311 is a thin film transistor, 312 is a liquid crystal element, 313 is a data signal wire supplying image signals, and 314 is a gate signal wire providing signals to control the switching of the thin film transistor 311. For each field, when a new image signal is supplied from the data wire 313, and a signal from the gate signal wire 314 is supplied to the thin film transistor, the thin film transistor 311 becomes a low resistance state, and the voltage applied to the liquid crystal element 312 rewrites it to a new image signal. After that, an off signal from the signal wire 314 is supplied to the thin film transistor, the thin film transistor becomes a high resistance state, and the voltage of the liquid crystal element 312 is maintained until being rewritten by the next field. Not only does a thin film transistor have a resistance component, but it also has a capacitance component between each terminal, that is, between the gate electrode and the source electrode, and between the gate electrode and the drain electrode. Consequently, when a thin film transistor goes on/off, the voltage caused by the switching of the thin film transistor is also applied to the liquid crystal element with the image signal of the liquid crystal element. When the capacitance component of each thin film transistor is not uniform for each pixel unit, a fixed pattern corresponding to the deviation of the capacitance appears in the images, and the image quality is deteriorated significantly. A human can recognize a difference in brightness to as little as 1%, but in order that such a fixed pattern be at or below the perceptual limit, the deviation of the gate insulation film that determines the deviation of the capacitance component had to be at least ±10% or less, desirably ±7% or less. Namely, it is because, when selecting the size of the thin film transistor in the relationship between the liquid crystal element and the thin film transistor shown in FIG. 32 such that the writing operations and the maintenance operations of the thin film transistor are satisfactory, the capacitance ratio of the liquid crystal and the thin film transistor and the liquid crystal becomes as much as 10:1. Furthermore, the ratio between the voltage caused by the image signals written to the liquid crystal element and the switching of the thin film transistor becomes as much as 10:1.

In the thin film transistor fabrication process, and in all cases of the application of thin film transistors, the deviation of film thickness of a gate insulation film within a substrate must be ±10% or less, preferably ±7% or less.

Also, regarding the space potential within the film and the surface charge of the film interface of the electrical properties of the silicon oxide film used as the gate insulation film of the thin film transistor, the method of evaluation is easy by forming the insulation film on a silicon wafer in the manner as below, forming an MOS capacitor, measuring the relationship between its capacitance and the applied voltage, and evaluating it as the shift from the ideal flat band voltage ($\Delta V_{F.B}$).

This value can be obtained by the method below. First, after a silicon oxide film has been formed by plasma CVD method on a silicon wafer, an aluminum electrode is formed in a dot shape on this silicon oxide film. Next, a MOS capacitor is constituted by connecting electrodes to the aluminum electrode and the silicon wafer, respectively, and after such, the shift from the ideal flat band voltage ($\Delta V_{F.B}$) is obtained from its capacitance-applied voltage properties. That is, ideally, it becomes flat band when the bias voltage (gate voltage) corresponds to the difference of the work functions of the aluminum and silicon. However, in actual elements there is a shift from the ideal flat band due to the existence of a space charge within the oxide film, and the existence of an surface charge caused by the surface state of the semiconductor surface in contact with the oxide film. Consequently, if the extent of such a shift is measured, it is possible to estimate with high correlation the internal quality of the element when the TFT has been configured.

Here, if a silicon oxide film having a small absolute value of the shift from the ideal flat band voltage ($\Delta V_{F.B}$) is used for a gate insulation film, the electrical properties of the TFT element are satisfactory. If a silicon oxide film having a great absolute value of the shift from the ideal flat band voltage ($\Delta V_{F.B}$) is used, the properties of the current at on state and leakage current at off state can be degraded.

Regarding these evaluation results, in a thermal oxide film formed in a comparatively high-temperature process, the shift from the ideal flat band voltage ($\Delta V_{F.B}$) is more or less −0.6V. In a low-temperature process, the shift from the ideal flat band voltage ($\Delta V_{F.B}$) should be a value of −1.0V or higher on the minus side and a value of +1.0V or lower on the plus side, in short, the absolute value of $\Delta V_{F.B}$ should be 1V or less. The reason is because, as the shift from the ideal flat band voltage ($\Delta V_{F.B}$) shifts greater on the plus side, the current at on state of a N-type TFT decreases, and the current at off state of a P-type TFT increases. On the other hand, as the shift from the ideal flat band voltage ($\Delta V_{F.B}$) shifts greater on the minus side, the current at on state of a P-type TFT decreases, and the current at off state of a N-type TFT increases. Consequently, it is because a shift in either direction causes bad influence when configured as a CMOS circuit, such as the decrease of circuit operations and the increase of power consumption. Because the voltage required for switching on/off of a TFT is as little as 2–3V, it is necessary to make the shift less than or equal to ±1V due to the existence of a space charge inside the gate oxide film and an surface charge caused by the surface state of the semiconductor surface in contact with the oxide film. Also, if the surface state of the semiconductor surface in contact with the TFT gate oxide film becomes greater, a decrease in the sharpness of the rise in the current at on state of both a N-type TFT and a P-type TFT, an increase in leakage current at off state, a rise in threshold voltage, and an increase in power consumption when configured as a CMOS circuit will be caused. However, examining the surface charge caused by the surface state of the semiconductor surface in contact with the oxide film, using a silicon wafer, such deterioration due to surface level is little enough to be ignored, if an oxide film gate insulation film of TFT is used having an $\Delta V_{F.B}$ of absolute value 1V or less.

TABLE 1

| Division | [SCCM] Flow rate of TEOS | [SCCM] Flow rate of oxygen | POWER [W] | Distance between electrodes [mm] | Pressure of reaction chamber [mTorr] | Temperature [° C.] |
|---|---|---|---|---|---|---|
| Examination 1 (FIGS. 4~6) | 120 Fixed to | 3000 Fixed to | 900 Fixed to | 12.7 Fixed to | 650 Fixed to | 284~334 |
| Examination 2 (FIGS. 7~9) | Fixed to 120 | 1000~4000 | Fixed to 900 | Fixed to 12.7 | Fixed to 650 | Fixed to 300 |
| Examination 3 (FIGS. 10~12) | 80~120 | 3000 Fixed to | 900 Fixed to | 12.7 Fixed to | 650 Fixed to | 300 Fixed to |
| Examination 4 (FIGS. 13~15) | 120 Fixed to | 3000 Fixed to | 900~1200 | 12.7 Fixed to | 650 Fixed to | 300 Fixed to |
| Examination 5 (FIGS. 16~18) | 120 Fixed to | 3000 Fixed to | 900 Fixed to | 12.7 Fixed to | 500~650 | 300 Fixed to |
| Examination 6 (FIGS. 19~21) | 120 Fixed to | 3000 Fixed to | 900 Fixed to | 5.0~15.0 | 650 Fixed to | 300 Fixed to |
| Examination 7 (FIGS. 22~24) | 120 Fixed to | 3000 Fixed to | 900~1200 | 12.7 Fixed to | 600 650 | 300 Fixed to |
| Examination 8 (FIGS. 25~27) | 120 Fixed to | 3000 Fixed to | 900~1200 | 12.7 Fixed to | 650 Fixed to | 300 313 |

(Scope of Examination)

Figure 28:
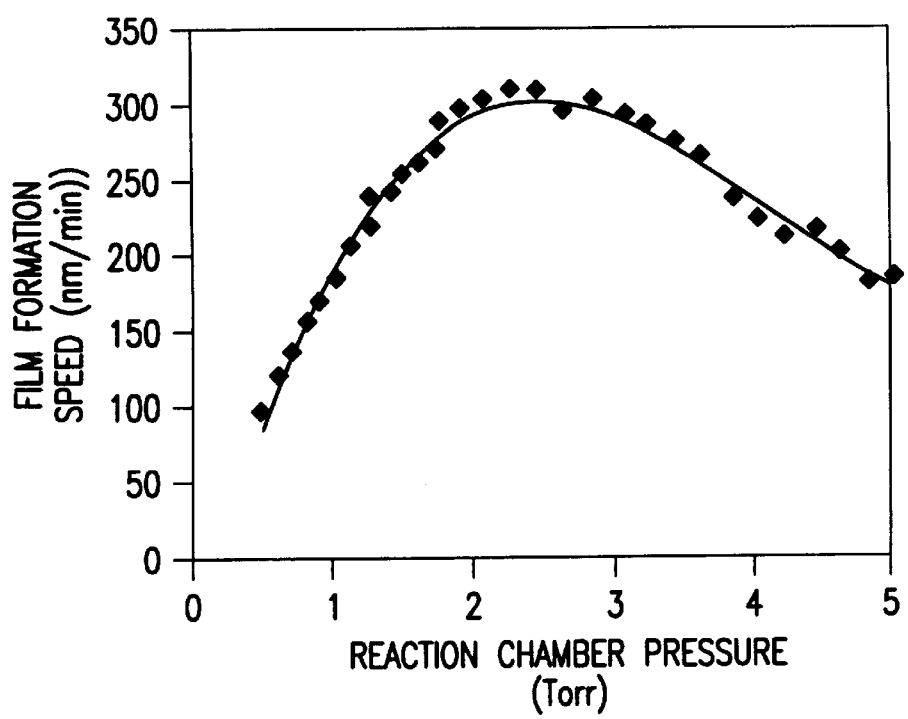
FIG. 28 is a graph showing the relationship between pressure of the reaction chamber and deposition rate of a film explaining the scope of examination of the present invention.

FIG. 28 makes clear the differences between the scope of examination of the film formation conditions and the prior art. The same graph is shown in a research report of a special interest group on applied electronic properties (Oyo Denshi Bussei Bunkakai), JSAP: AP922203 p. 7. In a plasma CVD method having TEOS and oxygen as the feed gases, according to increasing the pressure of the reaction chamber the deposition rate of the film increases. Once the maximum deposition rate of film is obtained, the deposition rate of the film decreases again. Such a change in deposition rate of the film is thought to show an immediate change of the rate-determining step of the film growth reaction around the same point having the maximum deposition rate of the film. Consequently, around this point, the various parameters of the deposition rate of the film and the film quality, that is, the pressure dependency, the substrate temperature dependency, the oxygen gas flow rate dependency, the TEOS gas flow rate dependency, the RF power source dependency, and the dependency of distance between electrodes can provide entirely different results. In the prior art, mainly a range of pressures greater than this pressure having the maximum deposition rate of a film has been examined. In the present invention, a range of pressures less than this pressure having the maximum deposition rate of film has been examined. This pressure having the maximum deposition rate of film is dependent on the distance between electrodes. That is, when the distance between electrodes is small, the pressure at which the deposition rate of film is maximum moves to the high-pressure side. FIG. 28 is a graph showing the relationship between pressure of the film formation chamber and the deposition rate of film when the distance between electrodes was 11.4 mm, and it is possible to realize conditions whereby the deposition rate of film becomes greater when the pressure becomes greater within a wide pressure range. The flow rate of TEOS at this time was 120 SCCM, the flow rate of oxygen was 3000 SCCM, the RF source power was 900 W, and the substrate temperature was 300° C. The present inventors have achieved good results by investigating in detail a scope of conditions different from the prior art, that is, a scope of film formation conditions with a small distance between electrodes and a low reaction chamber pressure, whereby the deposition rate of film becomes greater as the reaction chamber pressure becomes greater.

(Examination 1)

As shown in Table 1, in Examination 1, the flow rate of TEOS was set to 120 SCCM, the flow rate of oxygen was set to 3000 SCCM, and the RF source power was set to 900 W, and differing from the prior art, the distance between electrodes of the parallel flat electrodes was set to the small value of 12.7 mm and the pressure of the reaction chamber was set to the low value of 650 mtorr. The relationships between the substrate temperature during film formation and the film formation properties (deposition rate of film, shift from ideal flat band voltage, deviation of film thickness) were evaluated by changing the substrate temperature during film formation within the range of 284° C. to 334° C. The results are shown in FIG. 4–FIG. 6.

Figure 4:
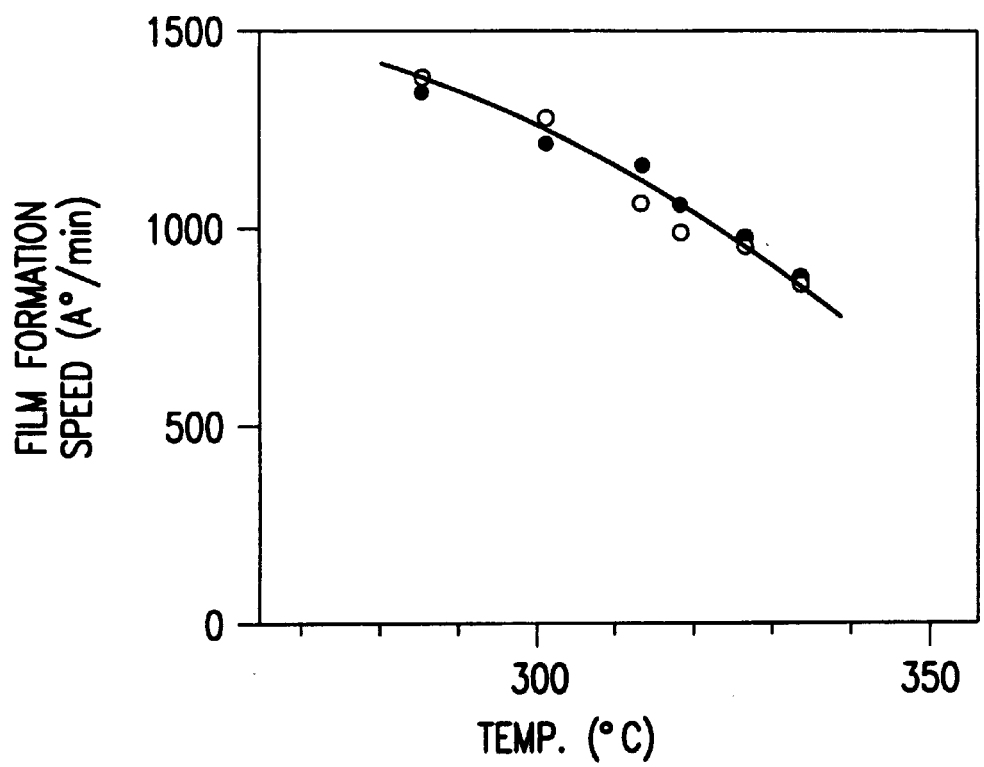
FIG. 4 is a graph showing the relationship between substrate temperature and the deposition rate of a film during film formation in a preferred embodiment (Examination 1) of the present invention.
Figure 5:
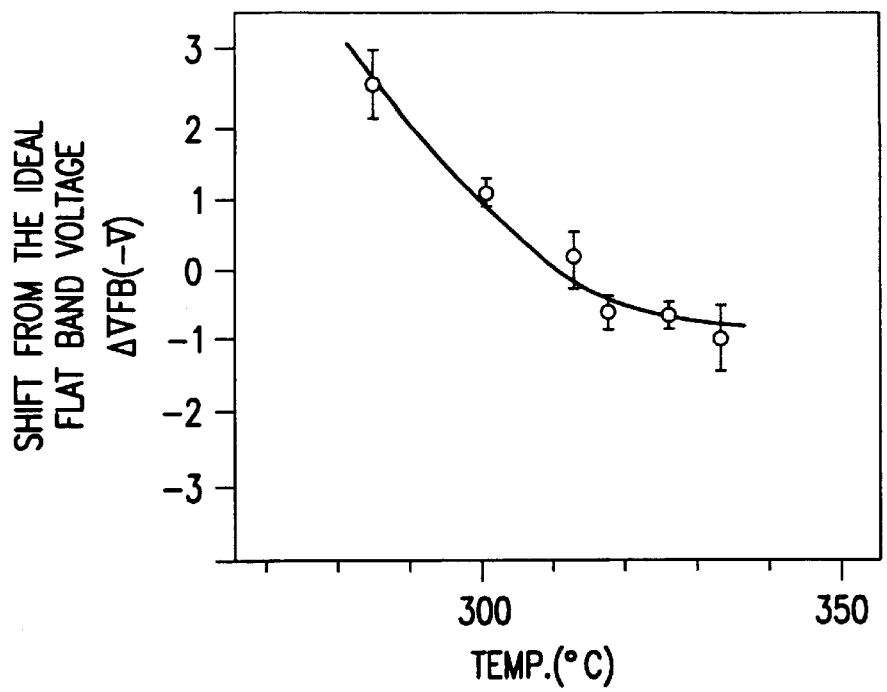
FIG. 5 is a graph showing the relationship between substrate temperature and shift from the ideal flat band voltage during film formation in a preferred embodiment (Examination 1) of the present invention.
Figure 6:
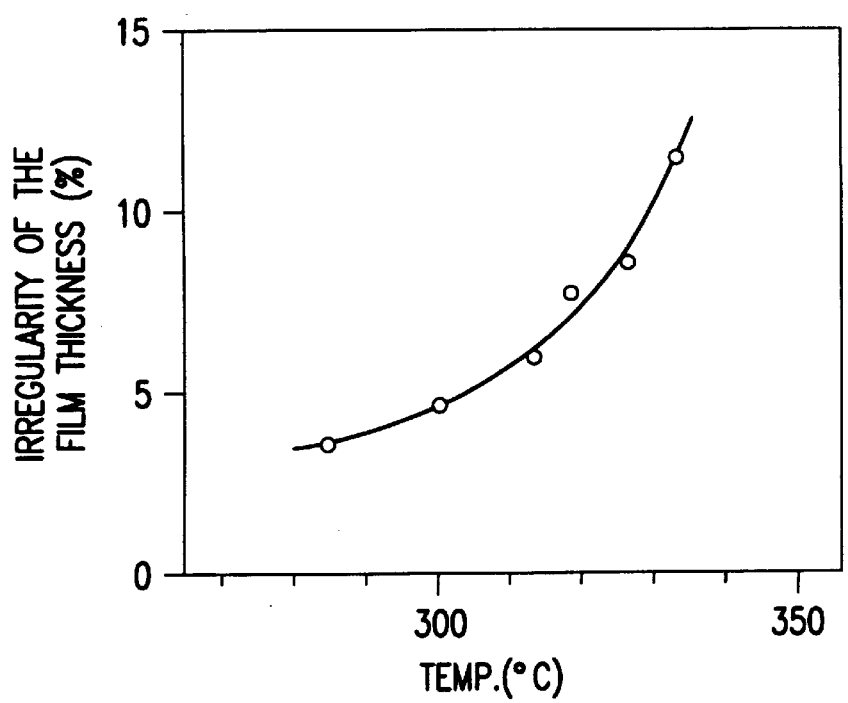
FIG. 6 is a graph showing the relationship between substrate temperature and deviation of the film thickness during film formation in a preferred embodiment (Examination 1) of the present invention.

As shown in FIG. 4–FIG. 6, when the substrate temperature during film formation was changed, the deposition rate of film and deviation of film thickness were improved as the substrate temperature was lowered, but differing from the prior art, the shift from the ideal flat band voltage increased steadily as the substrate temperature was lowered.

(Examination 2)

As shown in Table 1, in Examination 2, the flow rate of TEOS was set to 120 SCCM, the RF source power was set to 900 W, and the substrate temperature during film formation was set to 300° C., and differing from the prior art, the distance between electrodes of the parallel flat electrodes was set to the small value of 12.7 mm and the pressure of the reaction chamber was set to the low value of 650 mtorr. The relationships between the flow rate of oxygen and the film formation properties (deposition rate of film, shift from ideal flat band voltage, deviation of film thickness) were evaluated by changing the flow rate of oxygen within the range of 1000 SCCM–4000 SCCM. The results are shown in FIG. 7–FIG. 9.

Figure 7:
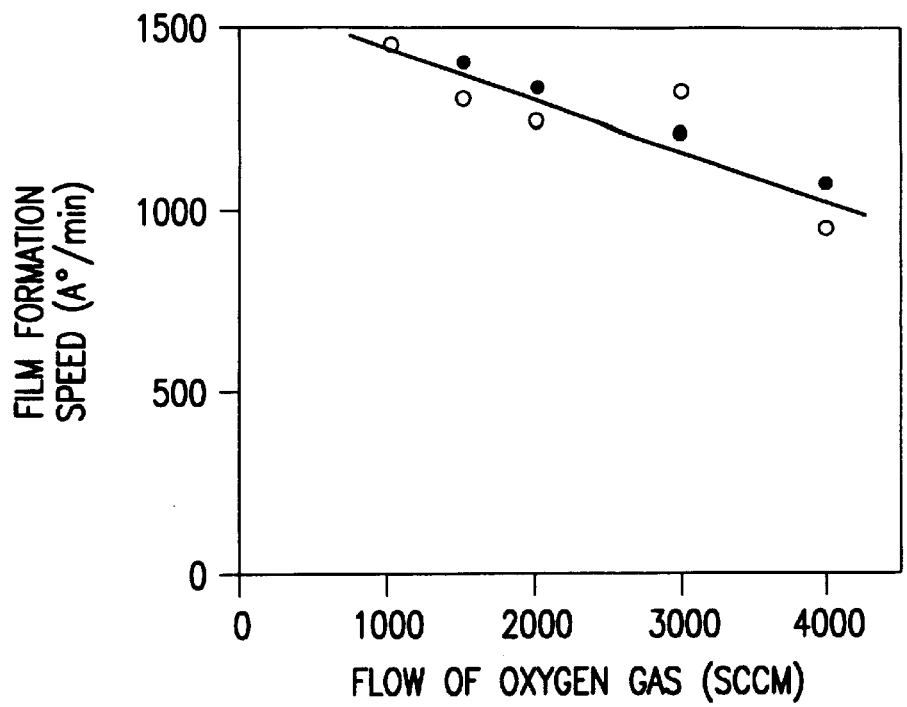
FIG. 7 is a graph showing the relationship between the flow rate of oxygen gas and the deposition rate of a film during film formation in a preferred embodiment (Examination 2) of the present invention.
Figure 8:
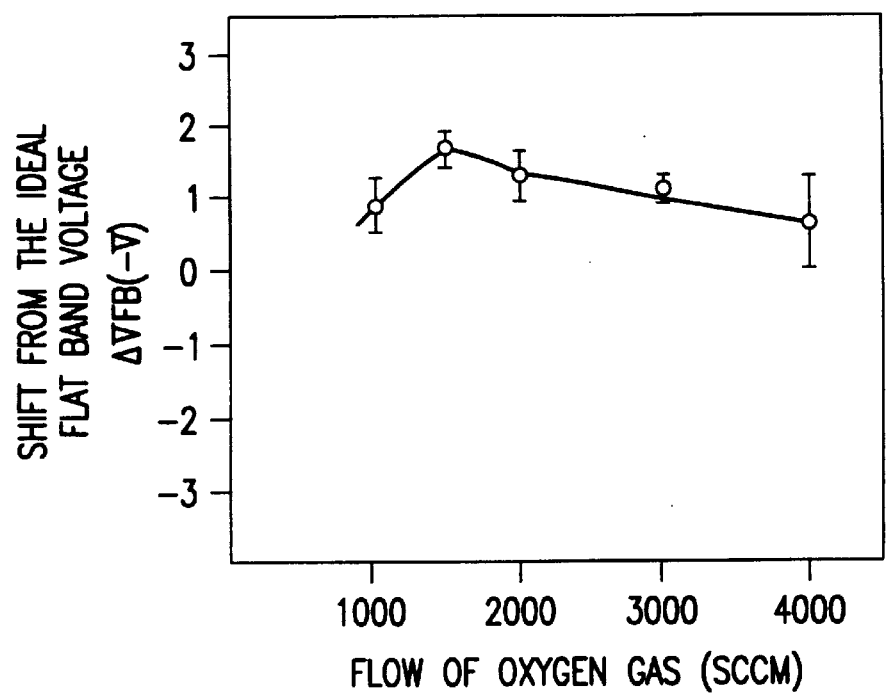
FIG. 8 is a graph showing the relationship between the flow rate of oxygen gas and shift from the ideal flat band voltage during film formation in a preferred embodiment (Examination 2) of the present invention.
Figure 9:
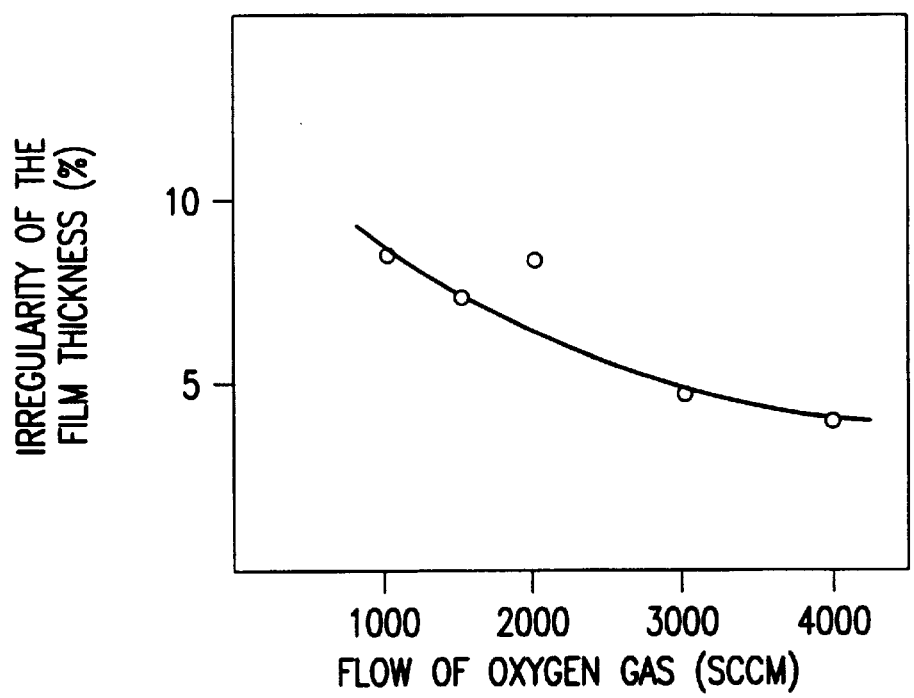
FIG. 9 is a graph showing the relationship between the flow rate of oxygen gas and deviation of the film thickness during film formation in a preferred embodiment (Examination 2) of the present invention.

As shown in FIG. 7–FIG. 9, when the flow rate of oxygen was changed, the deposition rate of film improved as the flow rate of oxygen was made smaller, but the uniformity of the film thickness was degraded.

The shift of the flat band voltage does not receive much influence from the flow rate of oxygen, but the maximum value is included in the range.

(Examination 3)

As shown in Table 1, in Examination 3, the flow rate of oxygen was set to 3000 SCCM, the RF source power was set to 900 W, and the substrate temperature during film formation was set to 300° C., and differing from the prior art, the distance between electrodes of the parallel flat electrodes was set to the small value of 12.7 mm and the pressure of the reaction chamber was set to the low value of 650 mtorr. The relationships between the flow rate of oxygen and the film formation properties (deposition rate of film, shift from ideal flat band voltage, deviation of film thickness) were evaluated by changing the flow rate of TEOS within the range of 80 SCCM–120 SCCM. The results are shown in FIG. 10–FIG. 12.

Figure 10:
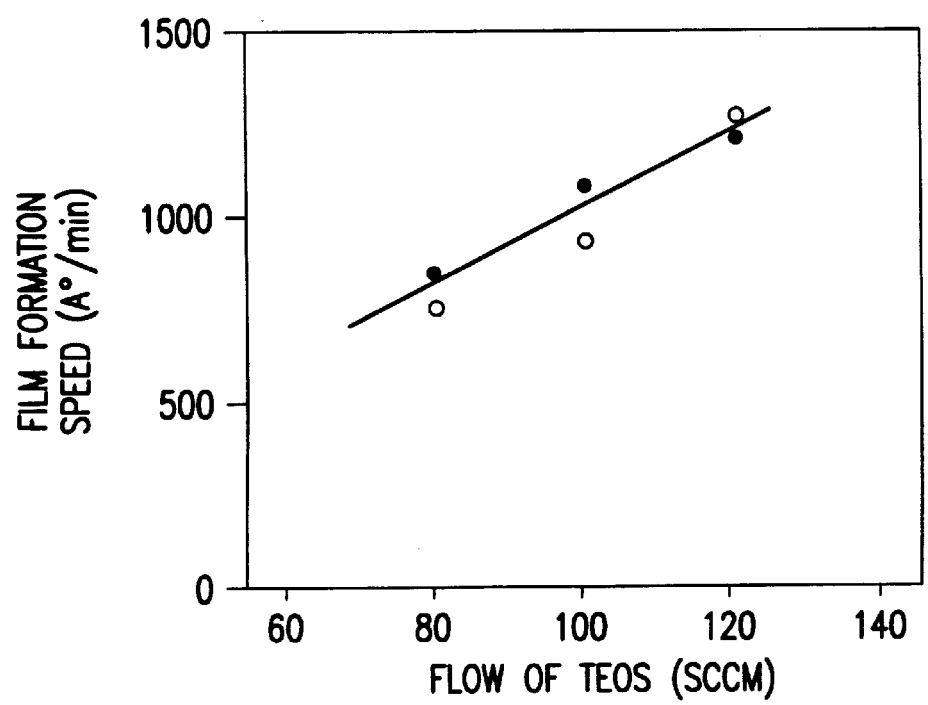
FIG. 10 is a graph showing the relationship between the flow rate of TEOS gas and the deposition rate of a film during film formation in a preferred embodiment (Examination 3) of the present invention.
Figure 11:
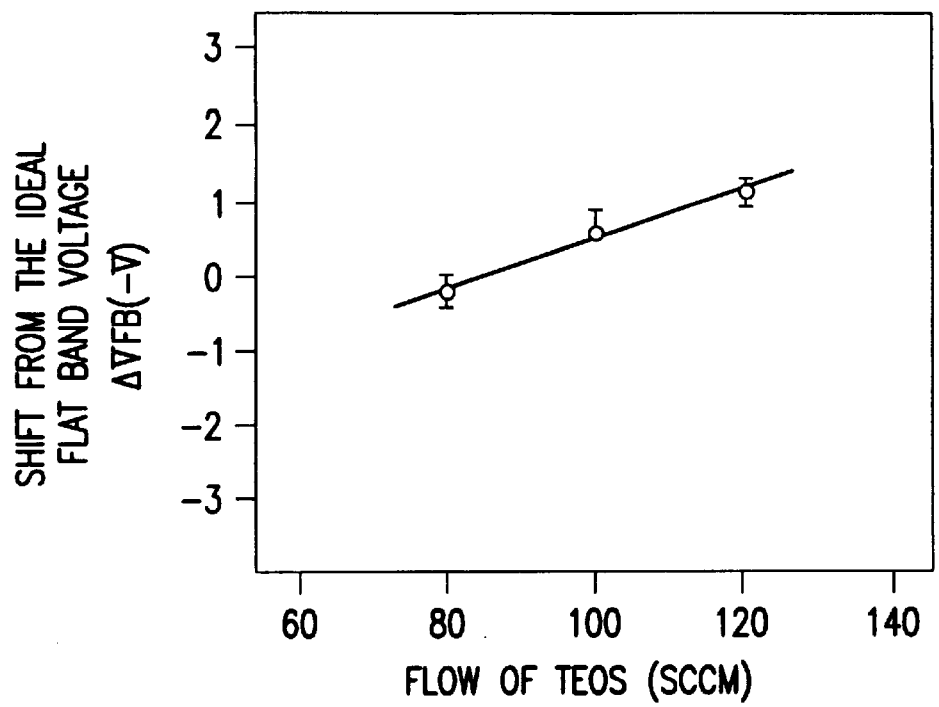
FIG. 11 is a graph showing the relationship between the flow rate of TEOS gas and shift from the ideal flat band voltage during film formation in a preferred embodiment (Examination 3) of the present invention.
Figure 12:
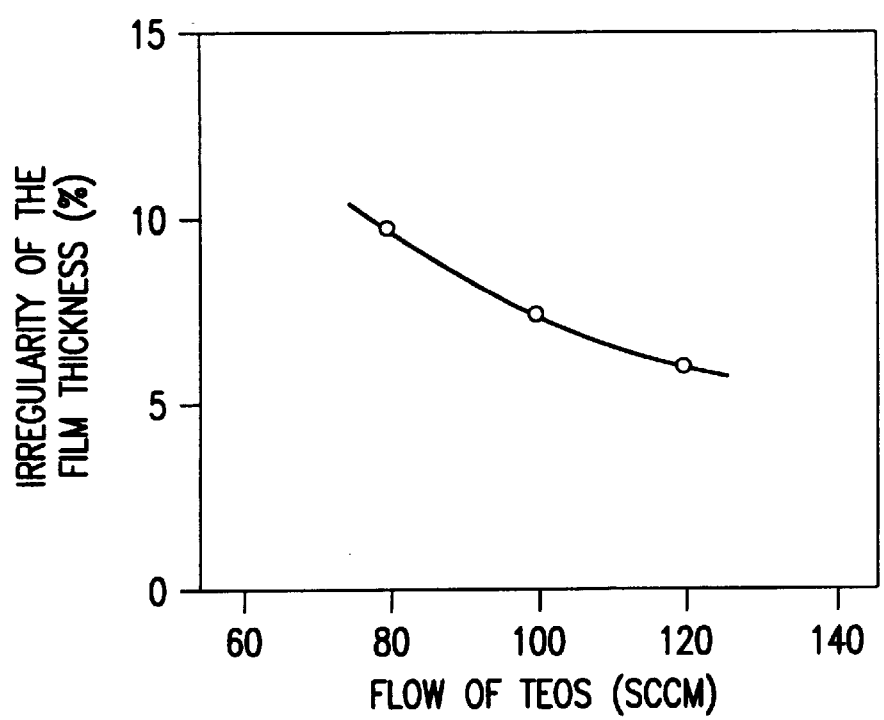
FIG. 12 is a graph showing the relationship between the flow rate of TEOS gas and deviation of the film thickness during film formation in a preferred embodiment (Examination 3) of the present invention.

As shown in FIG. 10–FIG. 12, when the flow rate of TEOS was changed, the deposition rate of film and the uniformity of the film thickness improved as the flow rate of TEOS was made greater, but the shift of the flat band increased. Regarding film quality, it was similar to the prior art.

(Examination 4)

As shown in Table 1, in Examination 4, the flow rate of TEOS was set to 120 SCCM, the flow rate of oxygen was set to 3000 SCCM, the distance between electrodes of the parallel flat electrodes was set to 12.7 mm, the pressure of the reaction chamber was set to 650 mtorr, and the substrate temperature during film formation was set to 300° C. The relationships between the RF source power and the film formation properties (deposition rate of film, shift from ideal flat band voltage, deviation of film thickness) were evaluated by changing the RF source power within the range of 900 W to 1200 W. The results are shown in FIG. 13–FIG. 15.

Figure 13:
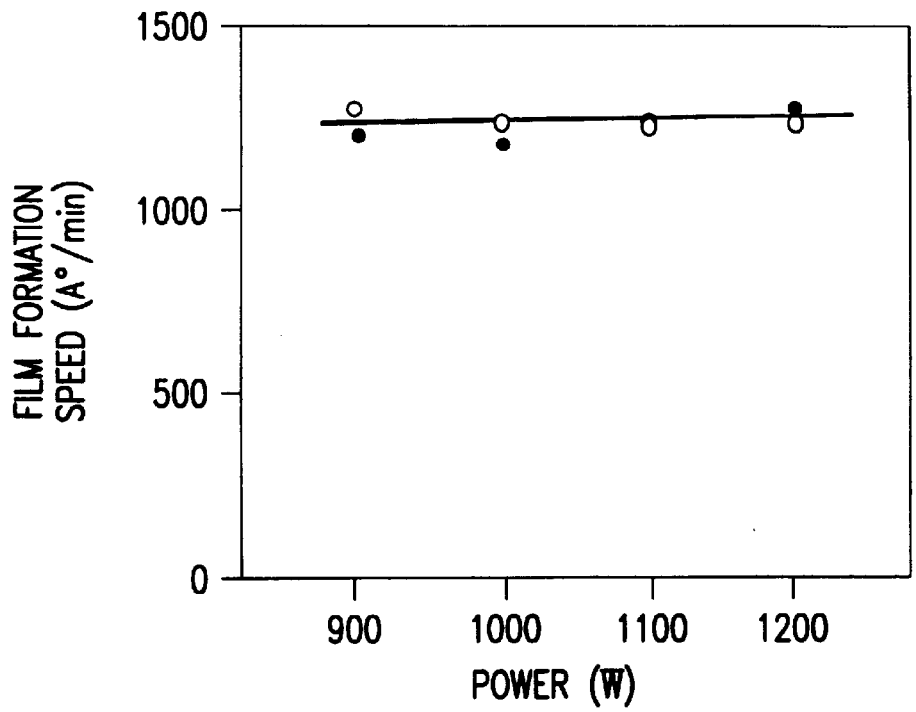
FIG. 13 is a graph showing the relationship between the flow of RF source power (output) and the deposition rate of film during film formation in a preferred embodiment (Examination 4) of the present invention.
Figure 14:
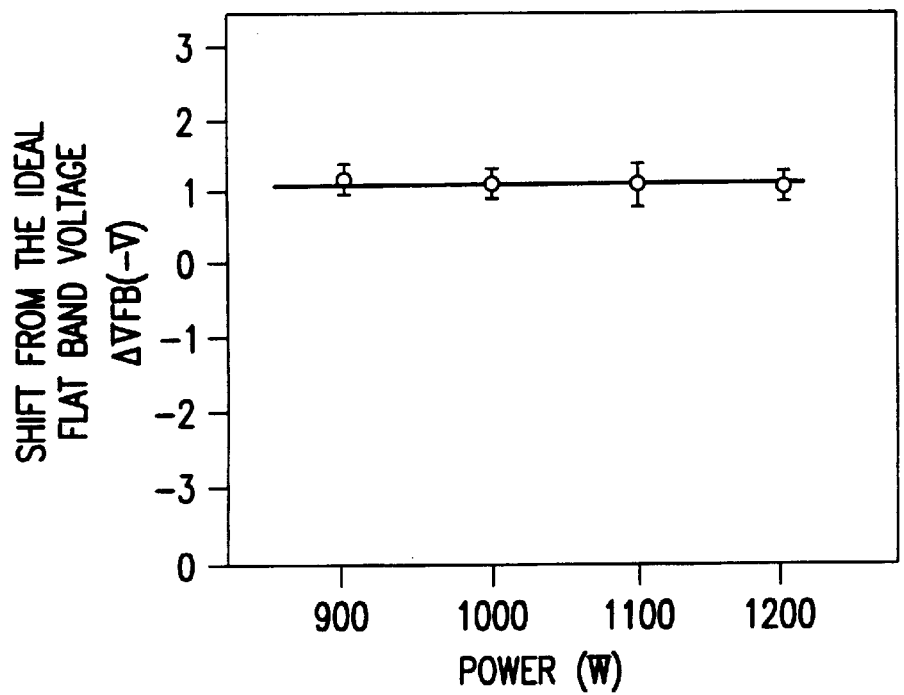
FIG. 14 is a graph showing the relationship between the flow of RF source power (output) and shift from the ideal flat band voltage during film formation in a preferred embodiment (Examination 4) of the present invention.
Figure 15:
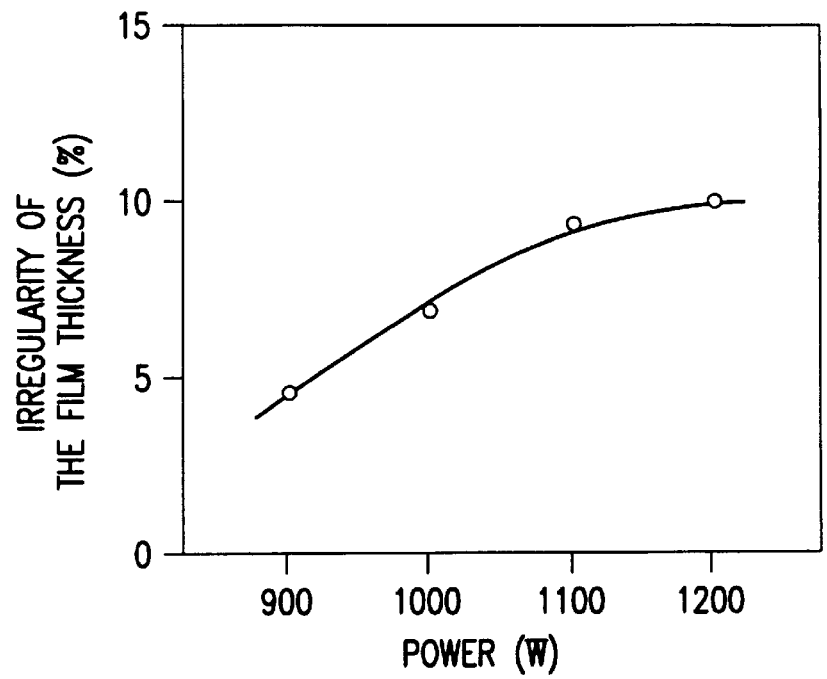
FIG. 15 is a graph showing the relationship between the flow of RF source power (output) and deviation of the film thickness during film formation in a preferred embodiment (Examination 4) of the present invention.

As shown in FIG. 13–FIG. 15, even when changing the RF source power within the range of 900 W to 1200 W, the deposition rate of film does not change. Also, differing from the prior art, the shift of the flat band voltage does not change. Furthermore, the uniformity of the film thickness is improved as the power is made less. Under the conditions that the distance between electrodes of the parallel flat electrodes is 12.7 mm or less, and the pressure of the reaction chamber is 650 mtorr, and the power is low, it is possible to improve the uniformity of the film thickness without sacrificing the deposition rate of film, and without increasing the shift from the flat band voltage.

(Examination 5)

As shown in Table 1, in Examination 5, the flow rate of TEOS was set to 120 SCCM, the flow rate of oxygen was set to 3000 SCCM, the RF source power was set to 900 W, the distance between electrodes of the parallel flat electrodes was set to 12.7 mm, and the substrate temperature during film formation was set to 300° C. The relationships between the pressure of the reaction chamber and the film formation properties (deposition rate of film, shift from ideal flat band voltage, deviation of film thickness) were evaluated by changing the pressure of the reaction chamber within the range of 500 mtorr to 650 mtorr. The results are shown in FIG. 16–FIG. 18.

Figure 16:
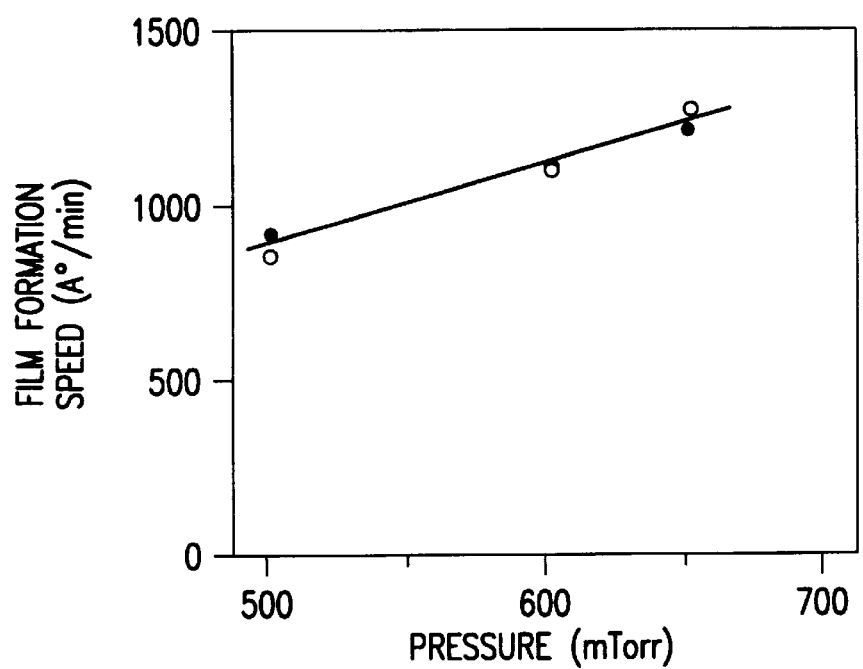
FIG. 16 is a graph showing the relationship between pressure of the reaction chamber and the deposition rate of a film during film formation in a preferred embodiment (Examination 5) of the present invention.
Figure 17:
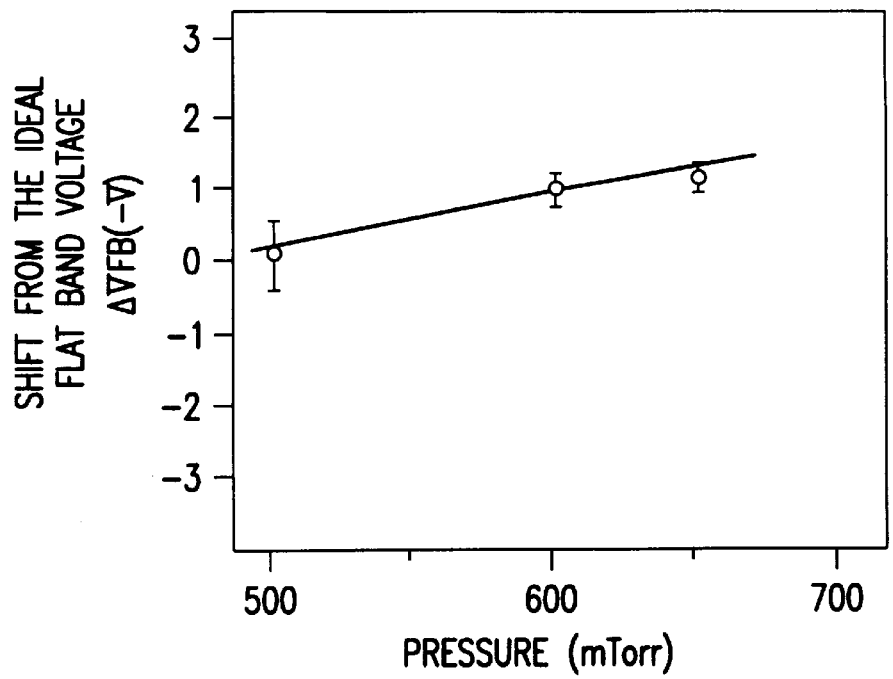
FIG. 17 is a graph showing the relationship between pressure of the reaction chamber and shift from the ideal flat band voltage during film formation in a preferred embodiment (Examination 5) of the present invention.
Figure 18:
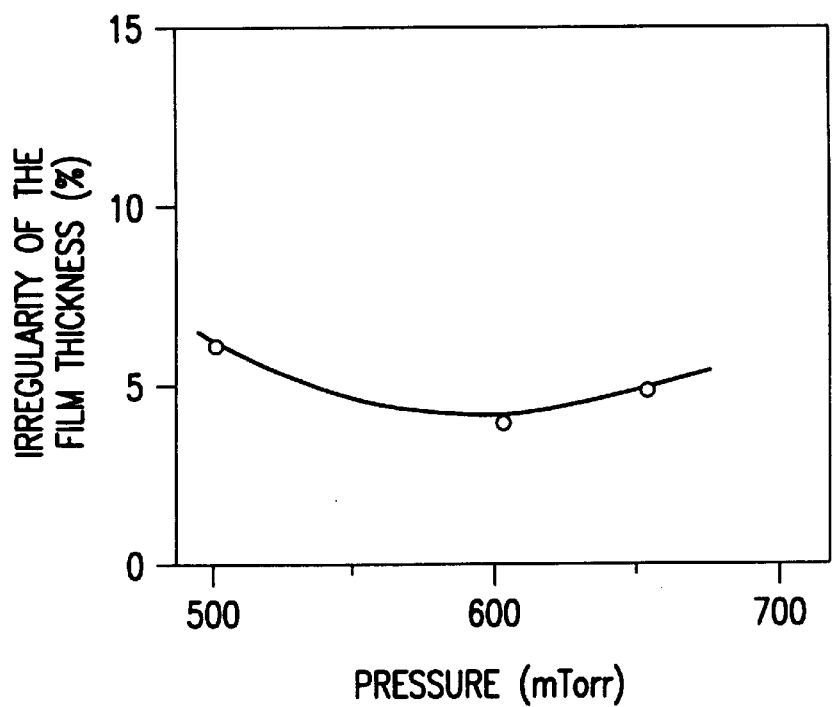
FIG. 18 is a graph showing the relationship between pressure of the reaction chamber and deviation of the film thickness during film formation in a preferred embodiment (Examination 5) of the present invention.

As shown in FIG. 16–FIG. 18, if the pressure of the reaction chamber is set within the range of 500 mtorr to 650 mtorr, the uniformity of the film thickness does not change greatly, but the deposition rate of film trends to improve slightly as the pressure of the reaction chamber is made higher. At this time as well, the shift of the flat band voltage only becomes somewhat greater.

Conversely, if the pressure of the reaction chamber is set within the range of 500 mtorr to 650 mtorr, the uniformity of the film thickness does not change much, but the shift of the flat band trends to decrease slightly as the pressure of the reaction chamber is lowered. At this time as well, the deposition rate of film only becomes somewhat lower. If the pressure of the reaction chamber was further lessened to 400 mtorr, the uniformity of the film thickness trends to become a somewhat worse ±8%. This is because pursuant to the decreasing of the pressure in the reaction chamber, the thermal contact with the lower flat electrode becomes less, and the temperature distribution within the substrate is worsened. However, even in this case, if the time of a raised temperature is made a little longer, up to 10 minutes, or if the pressure in the reaction chamber during stabilization of the substrate temperature is set to as little as 1 torr, or if the substrate temperature is first heated to as much as 300° C. in a preheating chamber, the uniformity of the film thickness could become ±5% or less. Furthermore, film formation at further lower pressures could not be achieved without changing the flow of the above-mentioned gases. When reducing the flow rate of gases and forming films in the same manner, the things that sacrifice the deposition rate of film are the uniformity of the film thickness and the small change in the shift of the flat band voltage. Also, when considering the stability of the plasma, a reaction chamber pressure of 100 mtorr or more was preferable.

(Examination 6)

As shown in Table 1, in Examination 6, the flow rate of TEOS was set to 120 SCCM, the flow rate of oxygen was set to 3000 SCCM, the RF source power was set to 900 W, the pressure in the reaction chamber was set to 650 mtorr, and the substrate temperature during film formation was set to 300° C. The relationships between the distance between electrodes of the parallel flat electrodes and the film formation properties (deposition rate of film, shift from ideal flat band voltage, deviation of film thickness) were evaluated by changing the distance between electrodes of the parallel flat electrodes within the range of 5.0 mm to 15.00 mm. The results are shown in FIG. 19–FIG. 21.

Figure 19:
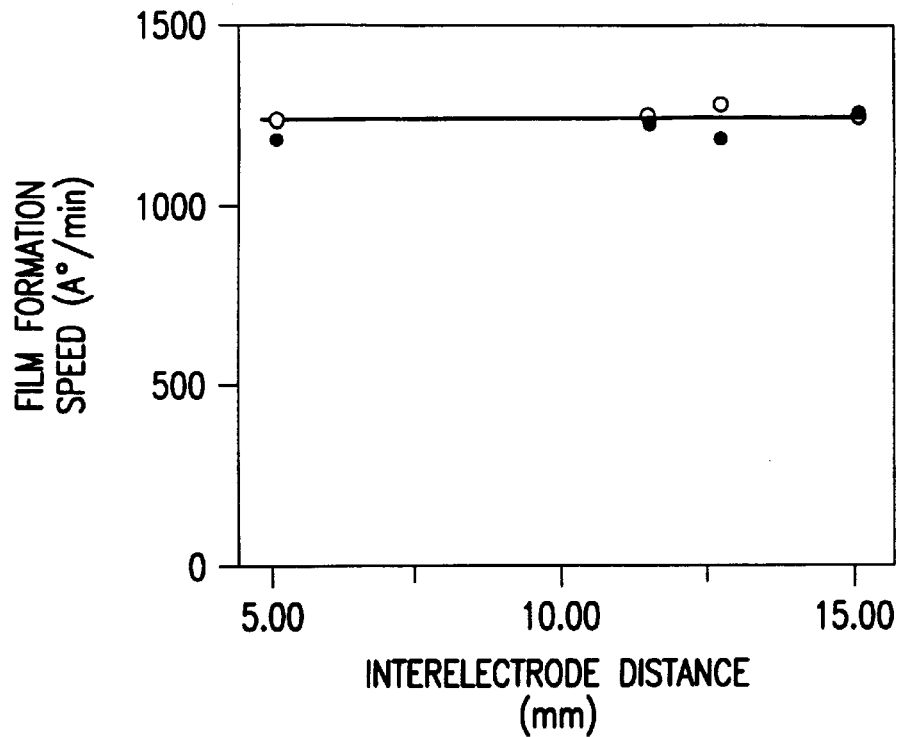
FIG. 19 is a graph showing the relationship between the distance between electrodes and the deposition rate of a film during film formation in a preferred embodiment (Examination 6) of the present invention.
Figure 20:
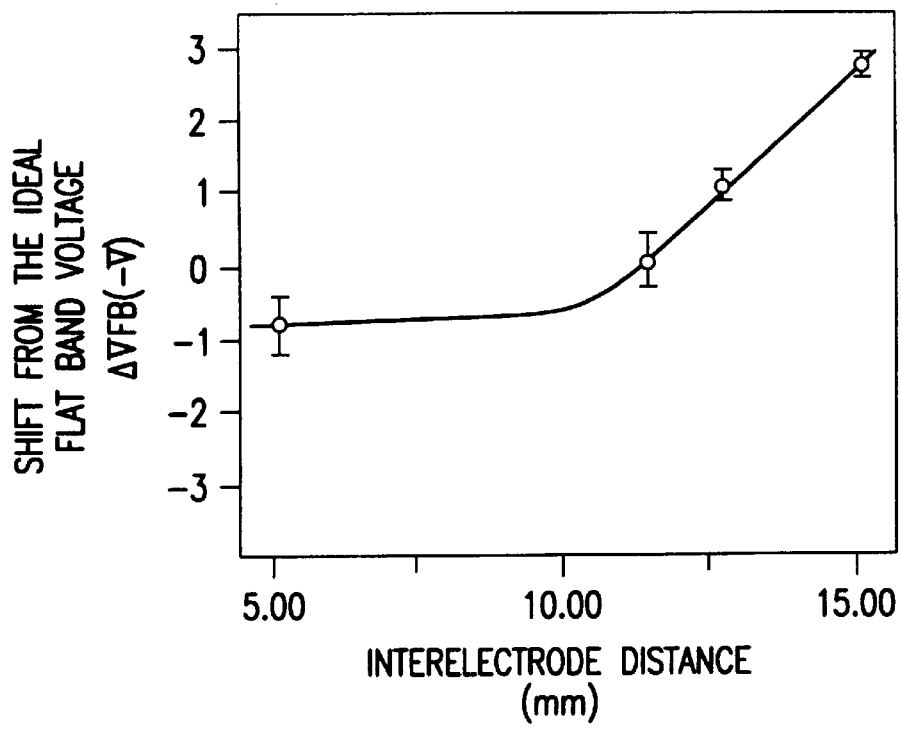
FIG. 20 is a graph showing the relationship between distance between electrodes and shift from the ideal flat band voltage during film formation in a preferred embodiment (Examination 6) of the present invention.
Figure 21:
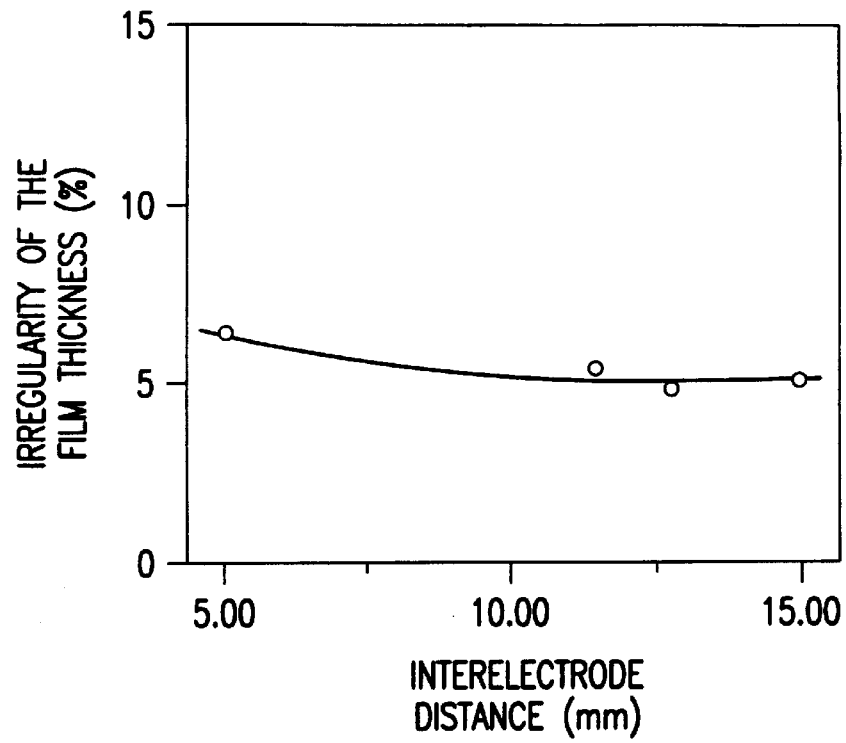
FIG. 21 is a graph showing the relationship between distance between electrodes and deviation of the film thickness during film formation in a preferred embodiment (Examination 6) of the present invention.

As shown in FIG. 19–FIG. 21, when the distance between electrodes of the parallel flat electrodes was changed, the deposition rate of film and the uniformity of the film thickness did not change much, but as the distance between electrodes of the parallel flat electrodes was made smaller, the shift of the flat band became markedly smaller, differing greatly from the prior art. That is, if the distance between electrodes of the parallel flat electrodes is within the range of 5.0 mm to 12.7 mm, it is possible to improve significantly the shift of the flat band without sacrificing the deposition rate of film and the uniformity of the film thickness. When the distance between electrodes is less than 5 mm, the plasma state during ignition of the plasma becomes unstable and undesirable. However, this phenomenon can be avoided by correcting the ranges of operating settings of the matching circuit, and the like.

(Examination 7)

As shown in Table 1, in Examination 7, the flow rate of TEOS is set to 120 SCCM, the flow rate of oxygen is set to 3000 SCCM, the distance between electrodes of the parallel flat electrodes is set to 12.7 mm, the pressure of the reaction chamber is set to 600 mtorr or 650 mtorr, and the substrate temperature during film formation is set to 300° C. The relationships between the RF source power and the film formation properties (deposition rate of film, shift from ideal flat band voltage, deviation of film thickness) were evaluated by changing the RF source power within the range of 900 W to 1200 W when the pressure of the reaction chamber was 600 mtorr and 650 mtorr, respectively. The results are shown in FIG. 22–FIG. 24.

Figure 22:
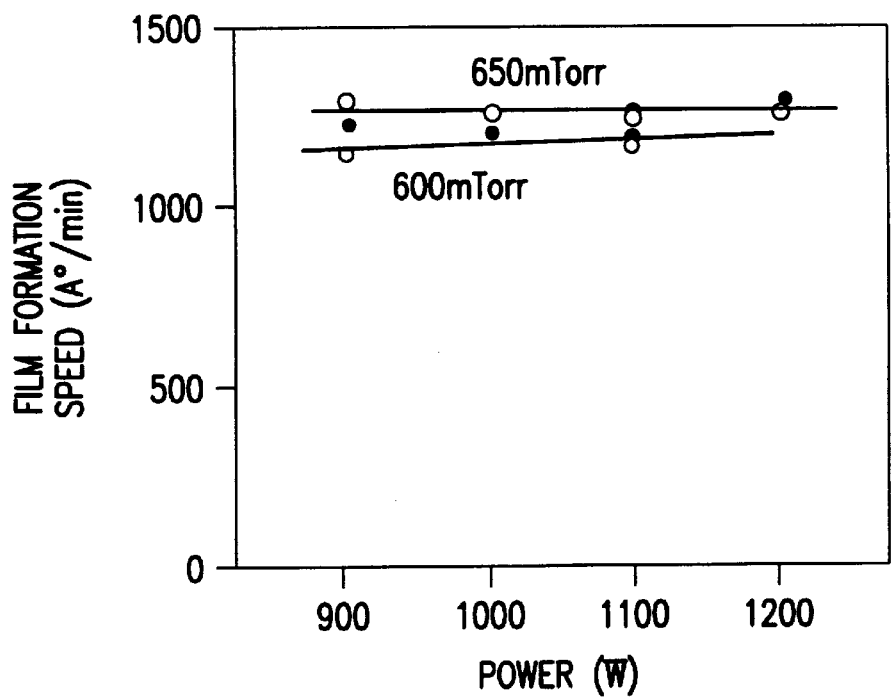
FIG. 22 is a graph showing the relationship between the flow of RF source power (output) and the deposition rate of a film when the pressures of the reaction chamber are 600 mtorr and 650 mtorr during film formation in a preferred embodiment (Examination 7) of the present invention.
Figure 23:
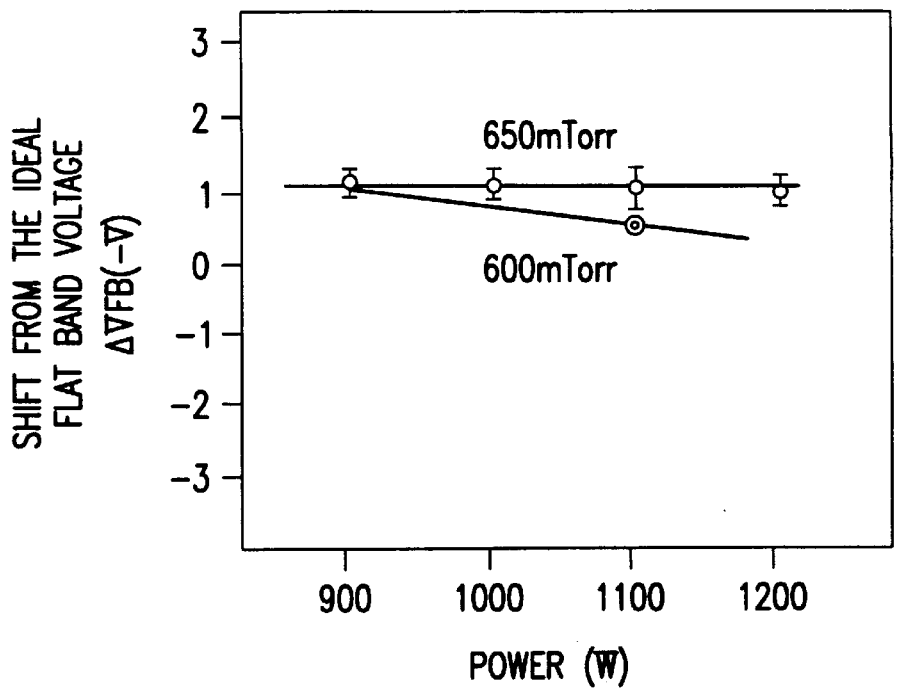
FIG. 23 is a graph showing the relationship between the flow of RF source power (output) and shift from the ideal flat band voltage when the pressure of the reaction chamber is 600 mtorr and 650 mtorr during film formation in a preferred embodiment (Examination 7) of the present invention.
Figure 24:
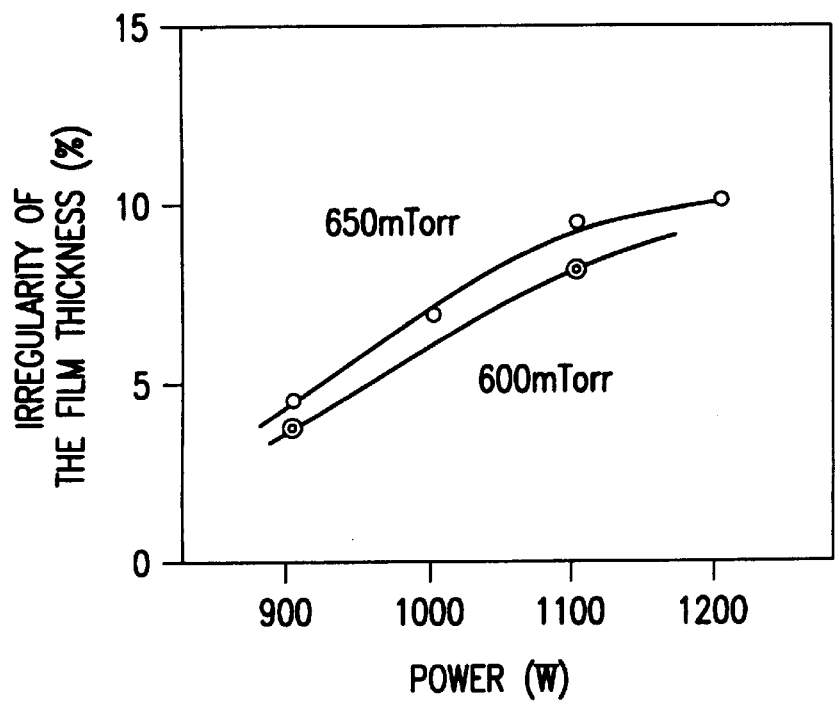
FIG. 24 is a graph showing the relationship between the flow of RF source power (output) and deviation of the film thickness when the pressure of the reaction chamber is 600 mtorr and 650 mtorr during film formation in a preferred embodiment (Examination 7) of the present invention.

As shown in FIG. 22–FIG. 24, if the power is reduced under the conditions whereby the distance between electrodes of the parallel flat electrodes is 12.7 mm and the pressure of the reaction chamber is 650 mtorr, whether the pressure of the reaction chamber is 600 mtorr or 650 mtorr, the uniformity of the film thickness can be improved. At this time, the deposition rate of film does not decrease. Also, the shift of the flat band voltage substantially does not increase when the pressure of the reaction chamber is 650 mtorr, and even at 600 mtorr, there is only a slight increase, and it can be checked to ±1.0V or less.

(Examination 8)

As shown in Table 1, in Examination 8, the flow rate of TEOS is set to 120 SCCM, the flow rate of oxygen is set to 3000 SCCM, the distance between electrodes of the parallel flat electrodes is set to 12.7 mm, the pressure of the reaction chamber is set to 650 mtorr, and the substrate temperature during film formation is set to 300° C. or 313° C. The relationships between the RF source power and the film formation properties (deposition rate of film, shift from ideal flat band voltage, deviation of film thickness) were evaluated by changing the RF source power within the range of 900 W to 1200 W when the substrate temperature during film formation was 300° C. and 313° C., respectively. The results are shown in FIG. 25–FIG. 27.

Figure 25:
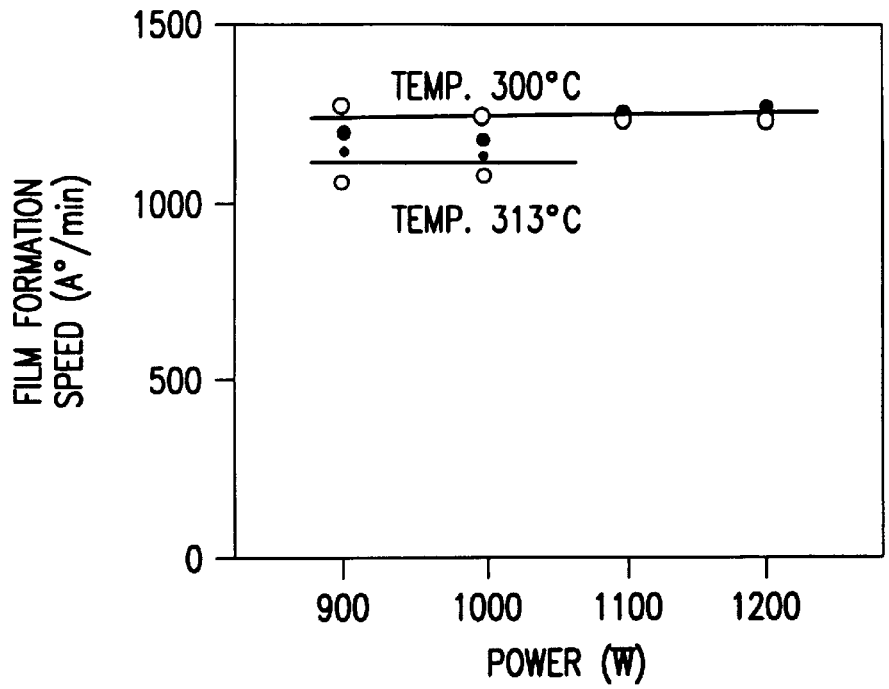
FIG. 25 is a graph showing the relationship between the flow of RF source power (output) and the deposition rate of a film when the temperature of the reaction chamber is 300° C. and 313° C. during film formation in a preferred embodiment (Examination 8) of the present invention.
Figure 26:
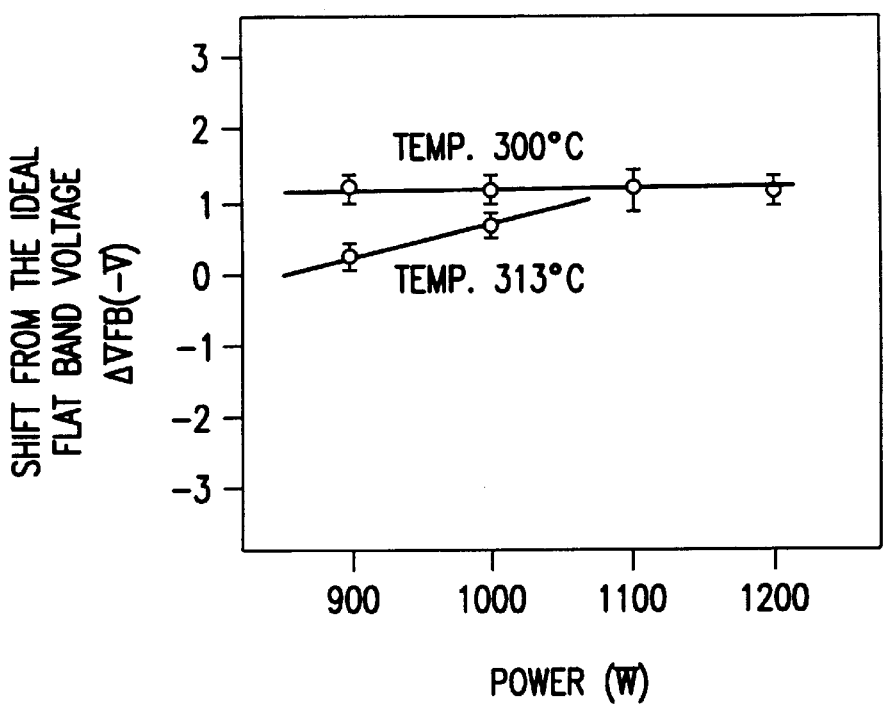
FIG. 26 is a graph showing the relationship between the flow of RF source power (output) and shift from the ideal flat band voltage when the temperature of the reaction chamber is 300° C. and 313° C. during film formation in a preferred embodiment (Examination 8) of the present invention.
Figure 27:
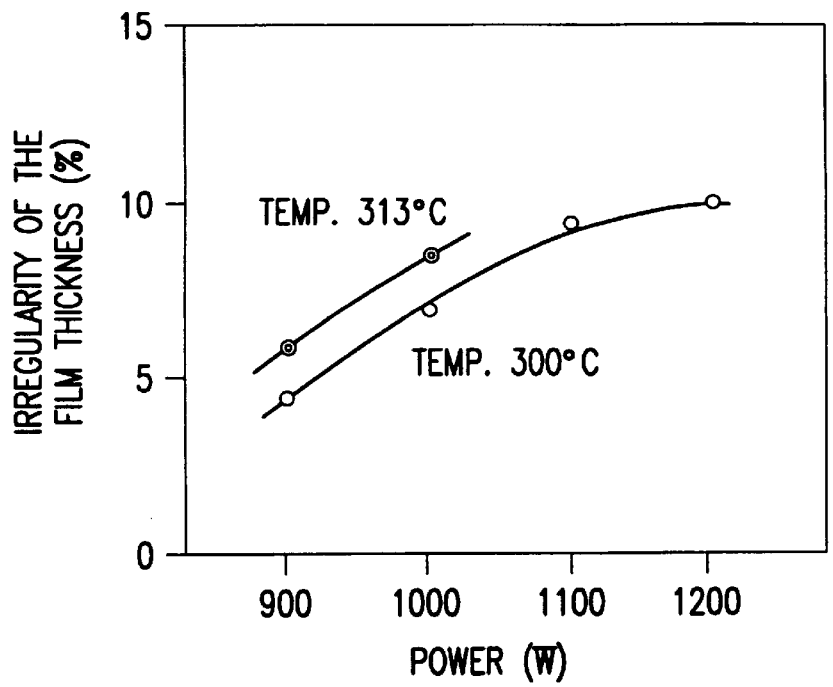
FIG. 27 is a graph showing the relationship between the flow of RF source power (output) and deviation of the film thickness when the temperature of the reaction chamber is 300° C. and 313° C. during film formation in a preferred embodiment (Examination 8) of the present invention.

As shown in FIG. 25–FIG. 27, if the power is lowered under the conditions whereby the distance between electrodes of the parallel flat electrodes is 12.7 mm and the pressure of the reaction chamber is 650 mtorr, whether the substrate temperature during film formation is 300° C. or 313° C., it is possible to improve the uniformity of the film thickness, and even in this case, the deposition rate of film does not decrease. Also, when the substrate temperature during film formation is 300° C., there is no increase of the shift from the flat band voltage even when the power is reduced, and when the substrate temperature during film formation is 313° C., the shift of the flat band voltage becomes smaller as the power is reduced.

(Examination 9)

Figure 32:
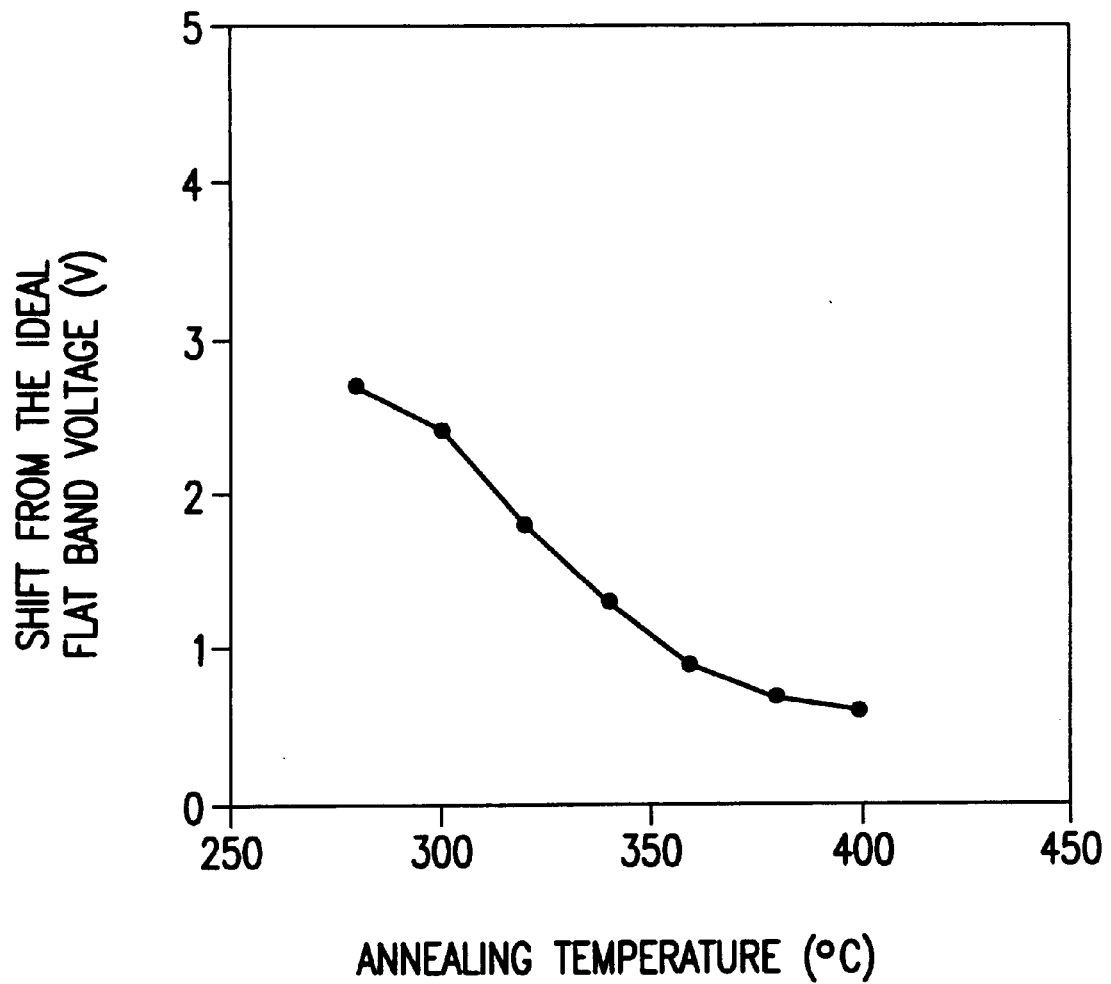
FIG. 32 is a graph showing the relationship between annealing temperature after film formation and shift of the flat band voltage in a preferred embodiment (Examination 9) of the present invention.

In Examination 9 as shown in FIG. 32, the flow rate of TEOS is set to 120 SCCM, the flow rate of oxygen is set to 3000 SCCM, the distance between electrodes of the parallel flat electrodes is set to 15 mm, the pressure of the reaction chamber is set to 650 mtorr, the substrate temperature during film formation is set to 300° C., and the RF source power is set to 900 W. The annealing temperature and the shift of the flat band voltage were evaluated when having annealed for one hour after film formation. The deposition rate of film is 1230 Angstrom/minute, and the deviation of film thickness is as low as 5%. The shift of the flat band voltage became smaller as the annealing temperature is raised. The annealing atmosphere is examined with nitrogen, oxygen, and hydrogen atmospheres, but there was no great difference. The effects of annealing similarly for various film formation conditions are examined, but when having formed the film under conditions indicating a small shift of the flat band voltage before annealing had the shift of the flat band voltage become even smaller, and there is no change in the size relationships before and after annealing.

(Examination 10)

In Examination 10, following the aforementioned examination results, an actual active matrix substrate for a liquid crystal display was created and its display capabilities were confirmed. The film formation conditions of the gate insulation film had the flow rate of TEOS set to 120 SCCM, the flow rate of oxygen set to 3000 SCCM, the RF source power set to 900 W, the distance between electrodes of the parallel flat electrodes set to 11.4 mm, the pressure of the reaction chamber set to 650 mtorr, and the substrate temperature during film formation set to 300° C. The deposition rate of film at this time was 1250 Angstrom/minute and the deviation of film thickness was ±5%.

Figure 33:
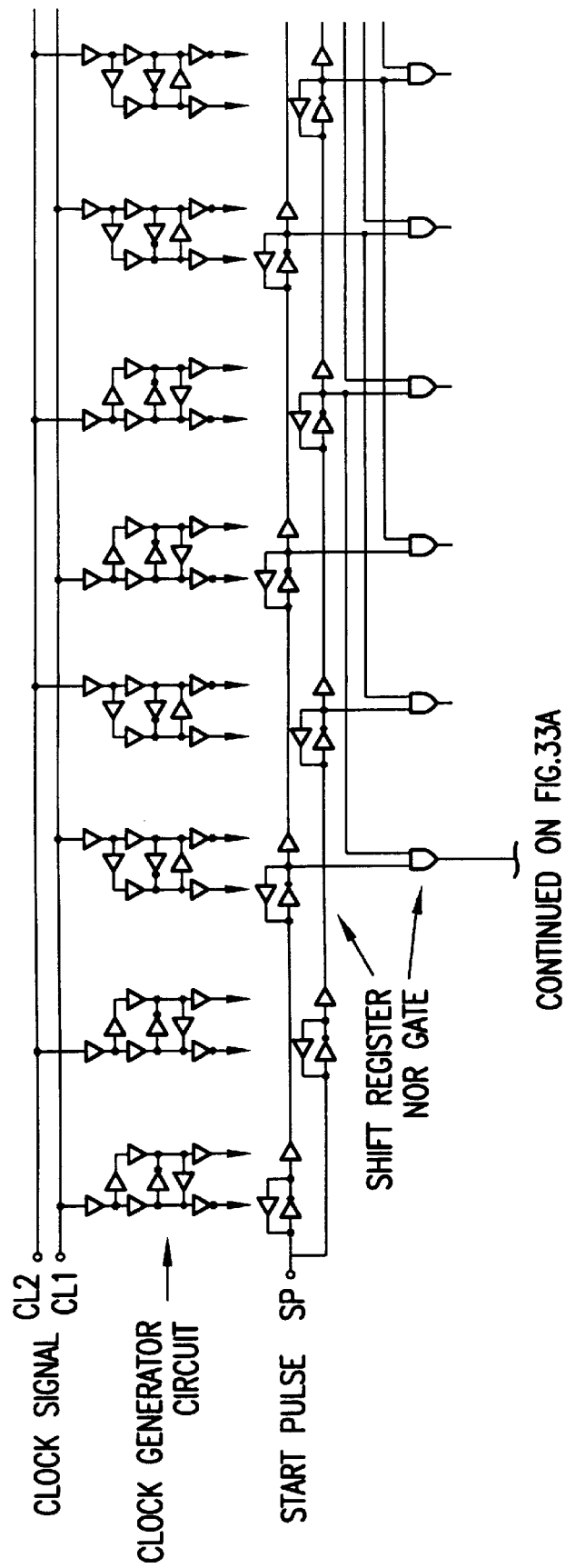
FIG. 33 is a view showing a circuit equivalent to an active matrix substrate in a preferred embodiment (Examination 10) of the present invention.
Figure 33A:
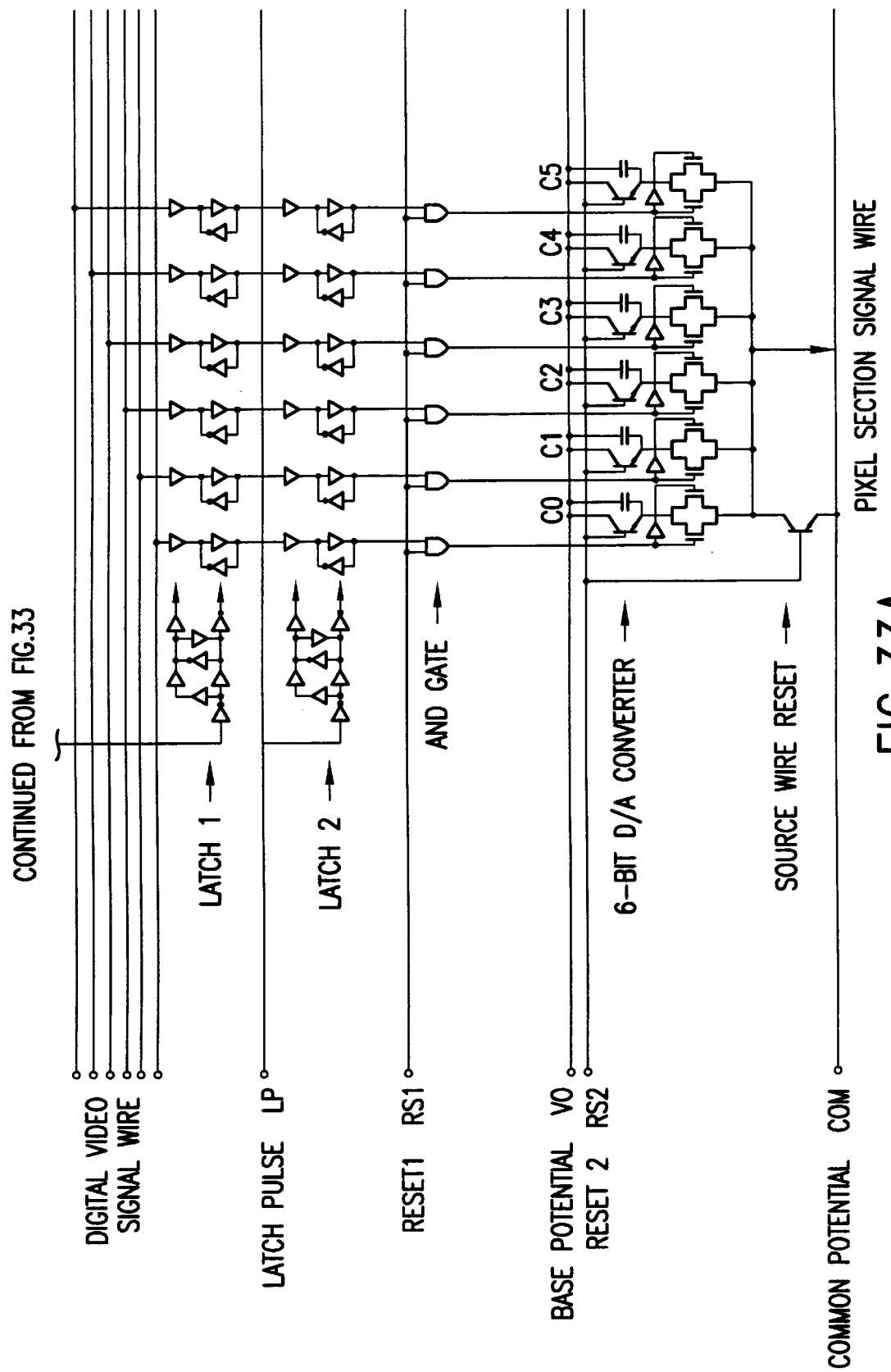

The fundamental fabrication method of the TFT was as mentioned before, but in Examination 10, a 360 mm×465 mm OA-2 manufactured by Nippon Electrical Glass Corporation was used as the glass substrate, and the undercoating protective layer was made 2000 Angstrom under the same film formation conditions as the gate insulation film. For the formation of the polycrystalline silicon film a laser annealing method is used, and for the formation of the source/drain regions an ion doping method is used. In addition, a pixel electrode made of indium tin oxide (ITO) was connected to one side of the source/drain electrode of each pixel TFT. In Examination 10, an active matrix substrate was manufactured having N-type thin film transistors as the pixel switching elements of a 200 (rows)×320 (columns)×3 (colors) =192,000 (pixels) color LCD, and having a 6-bit digital data driver (vertical driver) and a scanning driver (horizontal driver) installed in a CMOS thin film semiconductor device composed of N-type and P-type thin film transistors. In FIG. 33 is shown a circuit diagram of the 6-bit digital data driver. The digital data driver of the present preferred embodiment comprises a clock generator circuit, a shift register circuit, a NOR gate, a digital video signal wire, a latch circuit 1, a latch pulse wire, a latch circuit 2, a reset wire 1, an AND gate, a base potential wire, a reset wire 2, a capacitive-dividing 6-bit D/A converter, a CMOS analog switch, a common potential wire, and a source wire reset transistor, and the output from the CMOS analog switch is connected to the source wire of the pixel section. The capacitance of the D/A converter is formed using the gate insulation film, which satisfies the relationship of $C_0=C_1/2=C_2/4=C_3/8=C_4/16=C_5/32$, and the intermediate tones are represented by combinations of this capacitance. Into the digital video signal wire the digital video signals are inputted from the video random access memory (VRAM) of a computer. A liquid crystal panel is manufactured using an active matrix substrate obtained in this manner on one side of a pair of substrates. For the liquid crystals sandwiched between the pair of substrates TN type liquid crystals are used, and are made as a normally-white (white display when voltage is not applied to the liquid crystals) liquid crystal panel. Since the present invention is characterized by the gate oxide film having a high uniformity, proof is conducted of the uniformity in such a liquid crystal panel being sensitive to the deviation of the gate insulation film.

A liquid crystal display device was manufactured by connecting the obtained liquid crystal panel to external wiring. As a result, because the on-resistance and transistor capacitance of the N-type TFTs and the P-type TFTs are variously equivalent. Furthermore, because the TFTs are high-performance, the parasitic capacitance of the transistors is extremely small, and the properties throughout the surface of the substrate are uniform, a liquid crystal display device was produced, with both the 6-bit digital driver and the scanning driver operating normally over a wide operating region, and having a high display quality. In particular, the spottiness of the intermediate tones concomitant with deviation of film thickness of the gate insulation film of concern was at or below the perceptual limit. Also, because the fabrication process of the active matrix substrate also was stable, it became possible to manufacture the liquid crystal display device with stability and at low cost.

Thus, in the TFT fabrication method of the present invention, it was confirmed that, when forming a gate insulation film, when plasma-enhanced chemical vapor deposition method is used, when TEOS is used as the gas to provide the silicon, when the distance between electrodes for generating the plasma is made 12.7 mm or less, and if the results of the evaluations conducted in the past are followed, it is possible to suppress the influence of the space charge in the film and the surface charge of the film interface without sacrificing the deposition rate of film and the uniformity of the film thickness, regardless of the scope of conditions that had been considered involved in the decrease of film properties. Also, it was confirmed that, according to the results of repeatedly performed additional annealing experiments, if the distance between electrodes for generating the plasma is made about 15 mm, it is possible to reduce the influence of the charge inside the film and in the film interface without sacrificing the deposition rate of film and the uniformity of the film thickness. Consequently, following such film formation conditions, it is possible to form a silicon oxide film having film properties equal to or better than thermal oxide films while being a low-temperature process. Furthermore, it is possible to fabricate on large substrates at high productivity TFTs having stable current at on state and leakage current at off state. Therefore, according to the present example, it is possible to realize increased surface area and reduced cost of liquid crystal display panels, and the like.

In forming a gate insulation film when plasma chemical-enhanced vapor deposition method is used, TEOS is used as the gas for providing the silicon, the pressure inside the reaction chamber is made 650 mtorr or less, while being a low-temperature process, among the electrical film properties, it is possible to improve the charge behavior substantially without sacrificing the deposition rate of film. In this case as well, the uniformity of the film thickness was not sacrificed. Also, according to the results of repeatedly performed other experiments, it was confirmed that, if the pressure inside the reaction chamber is made 700 mtorr or less, it is possible to obtain the same results.

Furthermore, if the distance between electrodes of the parallel flat electrodes is made about 15 mm or less, and if the pressure of the reaction chamber is under a condition of being about 700 mtorr or less, although being a low-temperature process, the uniformity of the film thickness is improved as the power is made less. In this case as well, there was no decrease in deposition rate of film, and no increase in the shift of the flat band voltage.

It is desirable that the distance between electrodes of the parallel flat electrodes be 5 mm or more, and that the pressure of the reaction chamber be 100 mtorr or more.

As explained above, the TFT fabrication method pertaining to the present invention is a gate insulation film formation process, wherein plasma chemical vapor deposition is used, in addition, tetraethoxysilane is used as the gas to provide the silicon, and moreover, the distance between electrodes for generating the plasma is made about 15 mm or less. According to such a process, if the results of the evaluations conducted in the past are followed, because it is possible to suppress the influence of the space charge in the film and the surface charge of the film interface without sacrificing the deposition rate of film and the uniformity of the film thickness, regardless of the scope of conditions that had been considered the decrease of film properties, it is possible to form a silicon oxide film having film properties equal to or better than thermal oxide films while being a low-temperature process. Therefore, it is possible to fabricate on large substrates at high productivity TFTs having stable current at on state and leakage current at off state.

Also, in the gate insulation film formation process, when plasma chemical vapor deposition method is used, in addition, in this process, when TEOS is used as the gas for providing the silicon, and moreover, when the pressure inside the reaction chamber is made 650 mtorr or less, while being a low-temperature process, either the deposition rate of the film or charge behavior of electrical film properties can be improved without greatly sacrificing the other. In this case as well, because the uniformity of the film thickness was not sacrificed, it is possible to fabricate on large substrates TFTs having stable current at on state and leakage current at off state at high productivity while being a low-temperature process.

Also, if the distance between electrodes of the parallel flat electrodes is made about 15 mm or less, moreover, if the pressure of the reaction chamber is under a condition of being about 700 mtorr or less, it is possible to improve the uniformity of the film thickness as the power is made less. Therefore, it is possible to fabricate on large substrates TFTs having stable current at on state and leakage current at off state at high productivity while being a low-temperature process.

Also, when fabricating an active matrix substrate by the said fabrication method, because the on resistance and transistor capacitance of the N-type TFTs and the P-type TFTs are variously equivalent, furthermore, because the TFTs are high-performance, moreover, because the parasitic capacitance of the transistors is extremely small, and in addition, because the properties throughout the surface of the substrate are uniform, a liquid crystal display device was produced, with both the 6-bit digital driver and the scanning driver operating normally over a wide operating region, and having a high display quality. In particular, the capacitive dividing 6-bit digital driver as well, whereby the spottiness of the intermediate tones concomitant with deviation of film thickness of the gate insulation film is a concern, operated normally while maintaining the spottiness of the intermediate tones at or below the perceptual limit. Consequently, it became possible to digitize all the signals provided to the active matrix substrate, and a liquid crystal display device having little power consumption became possible. Also, because the active matrix substrate fabrication process also is stable, it became possible to fabricate liquid crystal display devices with stability and at low cost.

Possible Industrial Application

The present invention is applicable to active matrix substrate and liquid crystal display fabrication processes, and in particular, to a gate insulation film fabrication process.

What is claimed is:

1. A thin film transistor fabrication method, in which a gate electrode confronts with a channel region through a gate insulation film, the method comprising;

forming a silicon oxide film as said gate insulation film using plasma-enhanced chemical vapor deposition under the condition that tetraethoxysilane is used as a feed gas to provide silicon of the silicon oxide film and a distance between electrodes for generating the plasma is about 15 mm or less.

2. The thin film transistor fabrication method as defined in claim 1, wherein a distance between electrodes for generating the plasma is between 5 mm and 15 mm.

3. A thin film transistor fabrication method, in which a gate electrode confronts with a channel region through a gate insulation film, the method comprising;

forming a silicon oxide film as said gate insulation film using plasma-enhanced chemical vapor deposition under the condition that tetraethoxysilane is used as a feed gas to provide silicon of the silicon oxide film and pressure in a reaction chamber used for the plasma-enhanced chemical vapor deposition is less than 700 mtorr.

4. The thin film transistor fabrication method as defined in claim 3, wherein the pressure in the reaction chamber is more than 100 mtorr.

5. The thin film transistor fabrication method as defined in claim 1, wherein the pressure in a reaction chamber used for the plasma-enhanced chemical vapor deposition is less than 700 mtorr.

6. The thin film transistor fabrication method as defined in claim 5, wherein the pressure in the reaction chamber is more than 100 mtorr.

7. The thin film transistor fabrication method as defined in claim 1, further comprising forming the silicon oxide film using oxygen gas as a feed gas to provide the oxygen.

8. The thin film transistor fabrication method as defined in claim 1, a thickness of said gate insulation film is 200–3000 Angstroms.

9. An active matrix substrate fabrication method, wherein the active matrix substrate includes thin film transistors fabricated by the thin film transistor fabrication method as defined in claim 1.

10. The active matrix substrate fabrication method as defined in claim 9, wherein the active matrix substrate includes a capacitive-dividing type digital/analog converter.

11. A liquid crystal display device comprising an active matrix substrate fabricated by the active matrix substrate fabrication method as defined in claim 9, a corresponding substrate, liquid crystals, and drive signals for said active matrix substrate.

12. The thin film transistor fabrication method as defined in claim 1, wherein the film thickness of said gate insulation film 13 less than 3,000 Angstroms.

13. The thin film transistor fabrication method as defined in claim 3, further comprising forming the silicon oxide film using oxygen gas as a feed gas to provide the oxygen.

14. The thin film transistor fabrication method as defined in claim 3, wherein the film thickness of said gate insulation film is 200–3,000 Angstroms.

15. The thin film transistor fabrication method as defined in claim 3, wherein the film thickness of said gate insulation film is less than 3,000 Angstroms.

16. An active matrix substrate fabrication method, wherein the active matrix substrate includes thin film transistors fabricated by the thin film transistor fabrication method as defined in claim 3.

17. The active matrix substrate fabrication method as defined in claim 14, wherein the active matrix substrate includes a capacitive-dividing type digital/analog converter.

18. A liquid crystal display device comprising an active matrix substrate fabricated by the active matrix substrate fabrication method as defined in claim 14, a corresponding substrate, liquid crystals, and drive signals for said active matrix substrate.

* * * * *